United States Patent
Kang et al.

(10) Patent No.: US 8,456,850 B2
(45) Date of Patent: Jun. 4, 2013

(54) MEMORY CARDS AND ELECTRONIC MACHINES

(75) Inventors: JinTae Kang, Hwaseong-si (KR); Kisun Kim, Seoul (KR); Dongyang Lee, Yongin-si (KR); Doil Kong, Hwaseong-si (KR); Sunghoon Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/961,966

(22) Filed: Dec. 7, 2010

(65) Prior Publication Data

US 2011/0134620 A1 Jun. 9, 2011

Related U.S. Application Data

(60) Provisional application No. 61/282,041, filed on Dec. 7, 2009.

(30) Foreign Application Priority Data

Feb. 5, 2010 (KR) .................. 10-2010-0010989

(51) Int. Cl.
*H05K 7/00* (2006.01)
(52) U.S. Cl.
USPC ........... 361/737; 361/748; 361/752; 361/783; 439/135; 439/660
(58) Field of Classification Search
USPC .......... 361/737, 748, 741, 783, 752; 439/135, 439/607.22, 660; 257/679
See application file for complete search history.

(56) References Cited

U.S. PATENT DOCUMENTS

| | | | | |
|---|---|---|---|---|
| 6,097,605 A * | 8/2000 | Klatt et al. | ..................... | 361/737 |
| 6,381,143 B1 * | 4/2002 | Nakamura | ..................... | 361/737 |
| 6,738,259 B2 * | 5/2004 | Le et al. | ..................... | 361/737 |
| 6,945,465 B2 * | 9/2005 | Nishizawa et al. | ........... | 235/492 |
| 7,066,394 B2 * | 6/2006 | Kondo et al. | ................. | 235/492 |
| 7,152,801 B2 * | 12/2006 | Cuellar et al. | ................ | 235/492 |
| 7,291,903 B2 * | 11/2007 | Nishizawa et al. | ........... | 257/679 |
| 7,293,716 B1 * | 11/2007 | Miks | ..................... | 235/492 |
| 7,306,161 B2 * | 12/2007 | Takiar et al. | .................. | 235/492 |
| 7,314,388 B2 * | 1/2008 | Yamada et al. | ............... | 439/630 |
| 7,336,498 B2 | 2/2008 | Takiar et al. | | |
| 7,383,992 B2 * | 6/2008 | Le | ................................. | 235/441 |
| 7,628,653 B2 * | 12/2009 | Zhang et al. | ................... | 439/630 |
| 7,703,692 B2 * | 4/2010 | Aoki et al. | .................... | 235/492 |
| 7,731,538 B2 * | 6/2010 | Kiryu et al. | ................... | 439/630 |
| 7,771,238 B2 * | 8/2010 | Aoki et al. | .................... | 439/630 |

(Continued)

FOREIGN PATENT DOCUMENTS

| | | |
|---|---|---|
| KR | 10-2007-0096972 | 10/2007 |
| KR | 10-2009-0093770 | 9/2009 |

*Primary Examiner* — Angel R Estrada
*Assistant Examiner* — Dimary Lopez
(74) *Attorney, Agent, or Firm* — Harness, Dickey & Pierce, P.L.C.

(57) ABSTRACT

Provided is a memory card. The memory card includes interconnection terminals for electric connection with an external electronic machine. The interconnection terminals may be spaced from the front side of the memory card by a distance greater than the lengths of the interconnection terminals. Alternatively, the memory card may include other interconnection terminals between its front side and the former interconnection terminals. The former and latter interconnection terminals may be used for electric connection with different kinds of electronic machines.

17 Claims, 27 Drawing Sheets

U.S. PATENT DOCUMENTS

| | | | |
|---|---|---|---|
| 7,774,421 B2 * | 8/2010 | Dubovsky et al. | 709/206 |
| 7,823,793 B2 * | 11/2010 | Higuchi et al. | 235/492 |
| 2002/0125327 A1 * | 9/2002 | Izumi et al. | 235/487 |
| 2005/0111280 A1 | 5/2005 | Takiar et al. | |
| 2007/0138301 A1 * | 6/2007 | Cinkler | 235/492 |
| 2007/0252201 A1 | 11/2007 | Kito et al. | |
| 2008/0025003 A1 * | 1/2008 | Nishizawa et al. | 361/737 |
| 2009/0242966 A1 | 10/2009 | Son et al. | |

* cited by examiner

MEMORY CARDS AND ELECTRONIC MACHINES

PRIORITY STATEMENT

This application claims priority to Korean Patent Application No. 10-2010-0010989, filed Feb. 5, 2010, and claims the benefit of U.S. Provisional Application No. 61/282,041, filed Dec. 7, 2009, the entire contents of each of which are incorporated herein by reference.

BACKGROUND

The present disclosure herein relates to a memory card and an electronic machine, and more particularly, to a removable memory card and an electronic machine including a socket into which a removable memory card can be inserted.

Memory cards are removable cards used in connection with various electronic machines such as computers, digital cameras, digital camcorders, cellular phones, and personal digital assistants (PDAs) for storing or providing data such as image data and sound data. There are many kinds of memory cards such as memory stick cards, secure digital cards, compact flash cards, and smart media cards. Nonvolatile memories are usually used as memory cards, and flash memories are the most widely used nonvolatile memories.

SUMMARY

The present disclosure provides a new type of memory card.

Example embodiments of inventive concepts provide memory cards. In some example embodiments, the memory card may include a front side, a rear side, a first lateral side, a second lateral side, a top side, and a bottom side, a first set of interconnection terminals on at least one of the top side and the bottom side, the first set of interconnection terminals configured to operatively connect with an external electronic machine. Each of the first set of interconnection terminals may has a length parallel to a first direction and the first set of interconnection terminals are along a second direction perpendicular to the first direction, and at least some of the first set of interconnection terminals may be spaced apart from the front side by a distance greater than their lengths, respectively.

In other example embodiments of inventive concepts, there are provided electronic machines. The electronic machine comprising a socket therein, wherein the socket includes a first set of interconnection terminals configured to operatively connect with a first memory card; and a second set of interconnection terminals configured to operatively connect with a second memory card. The first set of interconnection terminals and the second set of interconnection terminals are parallel.

BRIEF DESCRIPTION OF THE DRAWINGS

The accompanying drawings are included to provide a further understanding of inventive concepts, and are incorporated in and constitute a part of this specification. The drawings illustrate example embodiments of inventive concepts and, together with the description, serve to explain example embodiments of inventive concepts. In the drawings.

DETAILED DESCRIPTION OF EXAMPLE EMBODIMENTS

Figure 1:
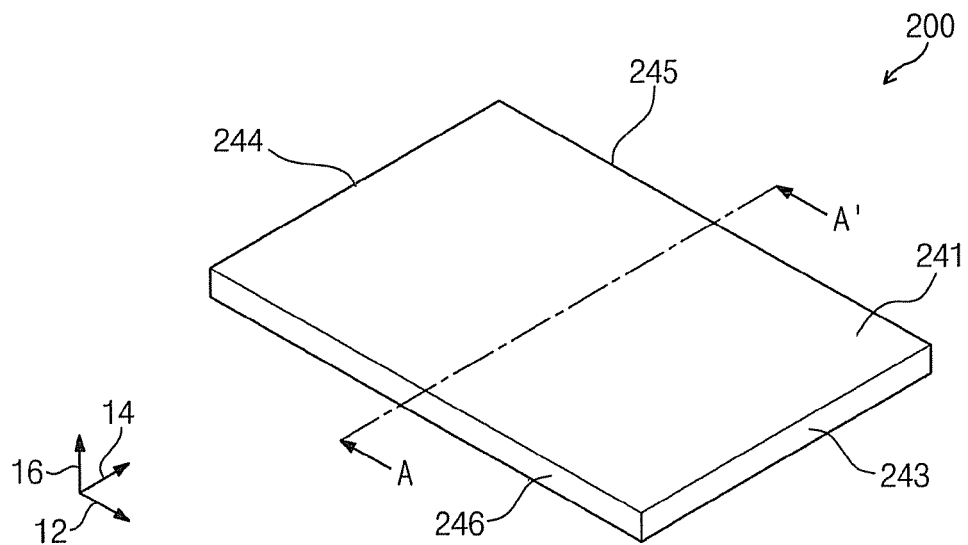
FIG. 1 is a top perspective view illustrating a memory card according to an example embodiment of inventive concepts.

The attached drawings for illustrating example embodiments of inventive concepts are referred to in order to gain a sufficient understanding of inventive concepts, the merits thereof, and objectives accomplished by the implementation of inventive concepts.

Hereinafter, inventive concepts will be described in detail by explaining example embodiments with reference to the attached drawings. In the drawings, lengths and sizes of layers and regions may be exaggerated for clarity. Like reference numerals in the drawings denote like elements.

It will be understood that, although the terms first, second, third etc. may be used herein to describe various elements, these elements should not be limited by these terms. These terms are used to distinguish one element from another. Thus, a first element discussed below could be termed a second element without departing from the teachings of inventive concepts.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

The terminology used herein is for the purpose of describing particular example embodiments only and is not intended to be limiting of inventive concepts. As used herein, the singular forms "a," "an" and "the" are intended to include the plural forms as well, unless the context clearly indicates otherwise. It will be further understood that the terms "comprises", "comprising", "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
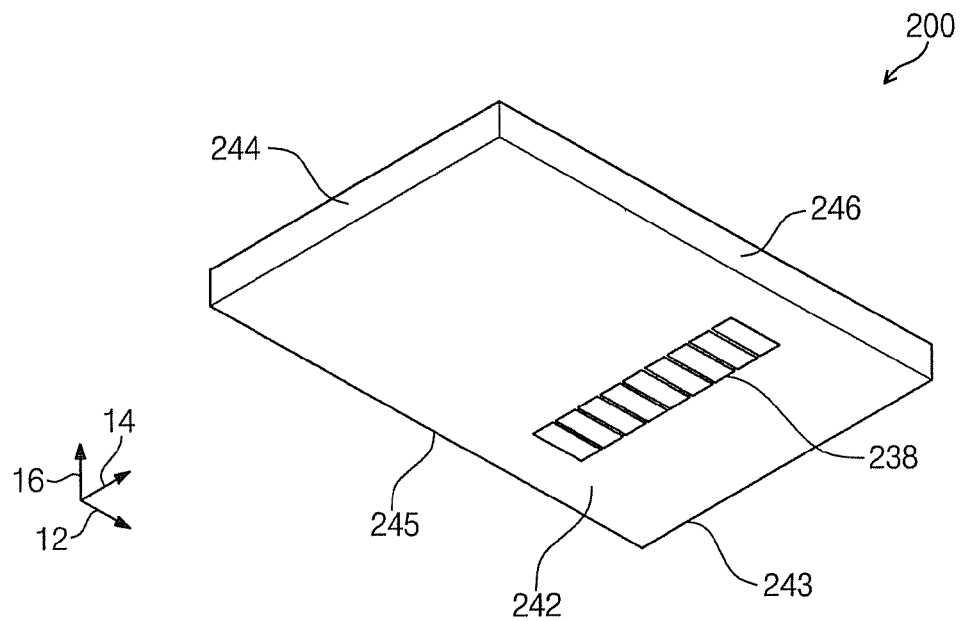
FIG. 2 is a bottom perspective view of the memory card illustrated in FIG. 1.
Figure 3:
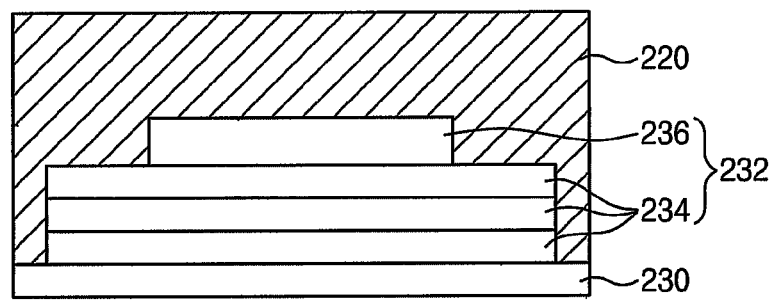
FIG. 3 is a sectional view taken along line A-A' of FIG. 1.

FIGS. 1 and 2 are perspective views illustrating a memory card 200 according to an example embodiment of inventive concepts. FIG. 3 is a sectional view taken along line A-A' of FIG. 1. FIG. 1 is a top perspective view illustrating the memory card 200, and FIG. 2 is a bottom perspective view illustrating the memory card 200. In the current example embodiment, the memory card 200 may use a nonvolatile memory. For example, the nonvolatile memory may be a flash memory.

Referring to FIGS. 1 through 3, the memory card 200 includes a circuit board 230, a semiconductor chip 232, and a mold member 220. The semiconductor chip 232 includes memory chips 234 and a controller chip 236. The memory chips 234 and the controller chip 236 may have a stacked structure. For example, the memory chips 234 may be superimposed on each other, and the controller chip 236 may be placed on top of the uppermost memory chip 234. In another example, only one memory chip 234 may be used. In another example, the memory chips 234 may be spaced apart from the controller chip 236. The controller chip 236 may be smaller than the memory chips 234.

Figure 17:
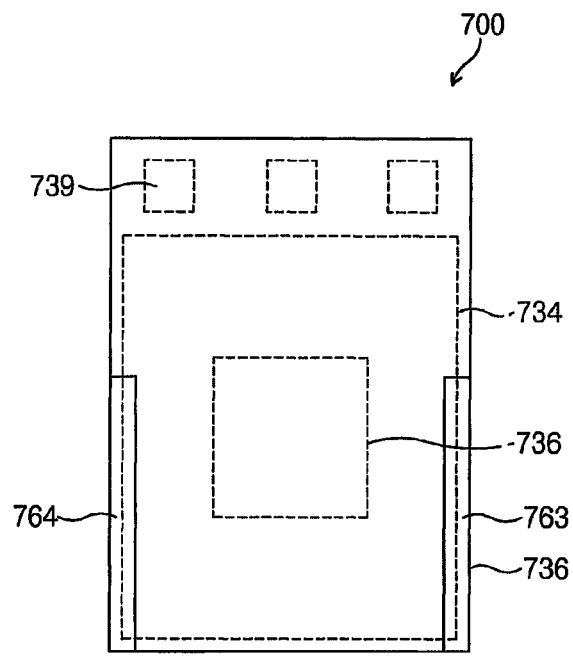

The circuit board 230 includes passive components (for example, passive components 739 shown in FIG. 17). The passive components may include a capacitor or a register. Interconnection terminals 238 are formed on an outer surface of the circuit board 230 for an electrical connection with an external electronic device (for example, an electronic machine 5100 shown in FIG. 36). One of the interconnection terminals 238 closest to a first lateral side 245 (described later) may be a power interconnection terminal for input/output (I/O). In addition, conductive traces (not shown) are formed on the circuit board 230 to electrically connect the chips 234 and 236, the interconnection terminals 238, and the passive components. The mold member 220 is provided to cover the top surfaces of the semiconductor chip 232 and the circuit board 230 entirely.

When viewed from the outside, the memory card 200 includes a top side 241, a bottom side 242, a front side 243, a rear side 244, the first lateral side 245, and a second lateral side 246. The front side 243 and the rear side 244 of the memory card 200 are approximately parallel with each other. In addition, the top side 241 and the bottom side 242 of the memory card 200 are approximately parallel with each other, and the top side 241 and the front side 243 are approximately perpendicular to each other. The first lateral side 245 and the second lateral side 246 of the memory card 200 are approximately parallel with each other. The first lateral side 245 is approximately perpendicular to the top side 241 and the front side 243. That is, the memory card 200 has an approximately thin parallelepiped shape. When viewed from the top side, a direction parallel with the first lateral side 245 will referred to as a first direction 12, and a direction parallel with the front side 243 will be referred to as a second direction 14. In addition, a direction perpendicular to the first direction 12 and the second direction 14 will be referred to as third direction 16.

A label (not shown) may be disposed on the top side 241. The label may be a sticker or printed with ink. At the bottom side 242 of the memory card 200, the interconnection terminals 238 are exposed. The interconnection terminals 238 may be disposed at a region of the bottom side 242 close to the front side 243. The interconnection terminals 238 may be arranged along the second direction 14. In addition, the interconnection terminals 238 may be parallel with the first direction 12.

The interconnection terminals 238 are spaced a predetermined distance from the front side 243. The predetermined distance may be determined in a manner such that the interconnection terminals 238 may not be superposed on interconnection terminals of a different memory card (such as interconnection terminals 5162 of a memory card 5160 of FIG. 37) having a size similar to that of the memory card 200. For example, the different memory card 5160 may be a micro secure digital card having interconnection terminals on a region of its bottom side close to its front side. In addition, the predetermined distance may be greater than the lengths of the interconnection terminals 238. The lengths of the interconnection terminals 238 may be equal. The interconnection terminals 238 may be aligned with each other. Alternatively, some of the interconnection terminals 238 may be longer than the other of the interconnection terminals 238. In this case, ends of the interconnection terminals 238 facing the rear side 244 may be aligned with each other. For example, the longer interconnection terminals 238 may be power terminals.

Figure 4:
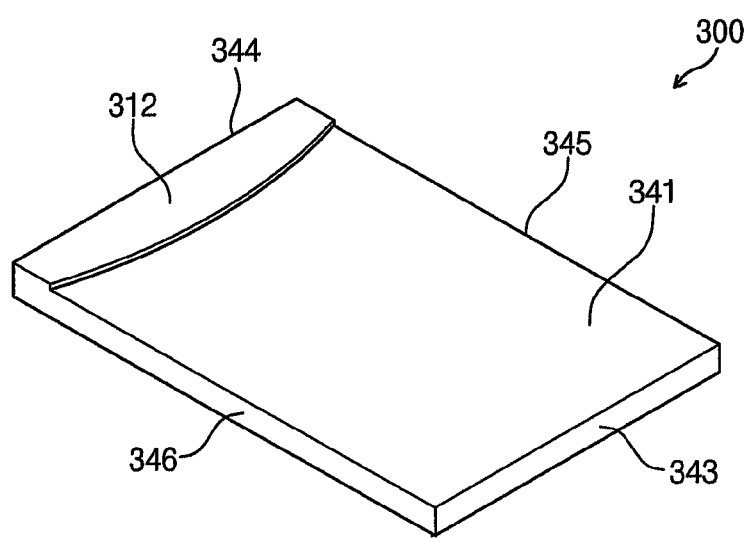
FIG. 4 is a top perspective view illustrating another example embodiment of the memory card of FIG. 1.
Figure 5:
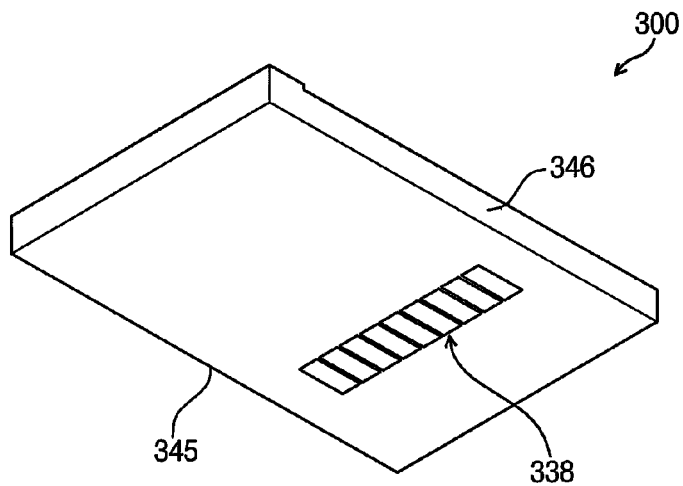
FIG. 5 is a bottom perspective view illustrating the memory card of FIG. 4.

FIGS. 4 and 5 illustrate a memory card 300. FIG. 4 is a top perspective view illustrating the memory card 300, and FIG. 5 is a bottom perspective view illustrating the memory card 300. The memory card 300 has a thin parallelepiped shape similar to that of the memory card 200 illustrated in FIGS. 1 through 3. Interconnection terminals 338 of the memory card 300 may be similar in position to the interconnection terminals 238 of the memory card 200 illustrated in FIGS. 1 through 3. A protrusion 312 is disposed on a top side 341 of the memory card 300. The protrusion 312 may be disposed in a region of the top side 341 close to a rear side 344 of the memory card 300. The protrusion 312 may extend to first and second lateral sides 345 and 346. In addition, the protrusion 312 may be rounded and convex toward a front side 343. Alternatively, the protrusion 312 may have a rectangular shape when viewed from the top side. Owing to the protrusion 312, a user may hold the memory card 300 easily. Relatively thick devices may be disposed on a circuit board of the memory card 300 under the protrusion 312.

Figure 6:
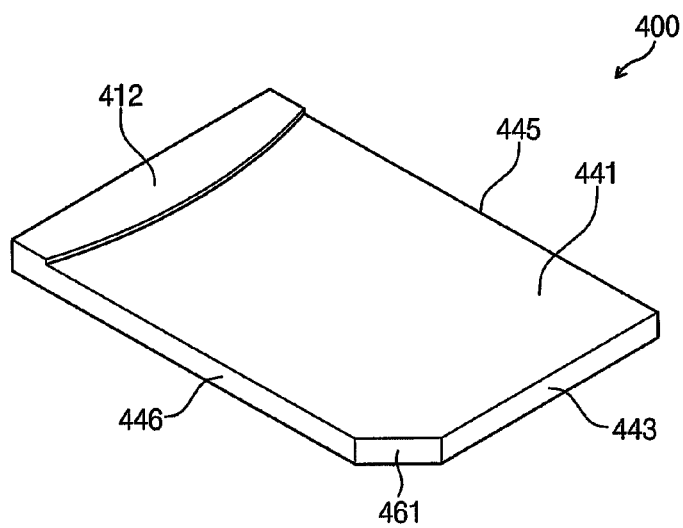
FIG. 6 is a top perspective view illustrating another example embodiment of the memory card of FIG. 1.
Figure 7:
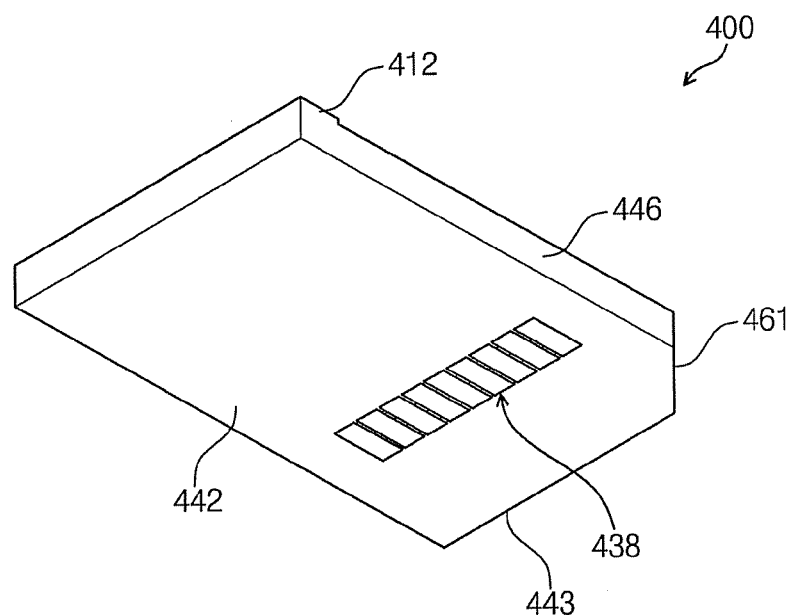
FIG. 7 is a bottom perspective view illustrating the memory card of FIG. 6.

FIGS. 6 and 7 illustrate a memory card 400. FIG. 6 is a top perspective view illustrating the memory card 400, and FIG. 7 is a bottom perspective view illustrating the memory card 400. The memory card 400 may have a thin parallelepiped shape similar to that of the memory card 200 illustrated in FIGS. 1 through 3. Interconnection terminals 438 of the memory card 400 may be similar in position to the interconnection terminals 238 of the memory card 200 illustrated in FIGS. 1 through 3. A protrusion 412, which is similar to the protrusion 312 of the memory card 300 of FIG. 4, may be disposed on a top side 441 of the memory card 400. In addition, the memory card 400 includes a chamfer 461 between a front side 443 and a second lateral side 446, and the chamfer 461 becomes distant from a first lateral side 445 as it goes from the front side 443 to the second lateral side 446. The chamfer 461 may extend from the top side 441 to a bottom side 442.

Figure 8:
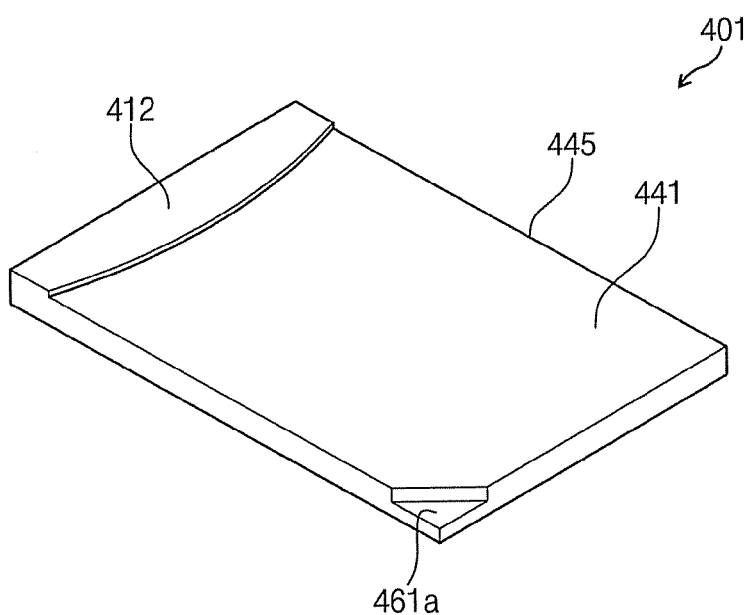
FIG. 8 is a top perspective view illustrating another example embodiment of the memory card of FIG. 1.
Figure 9:
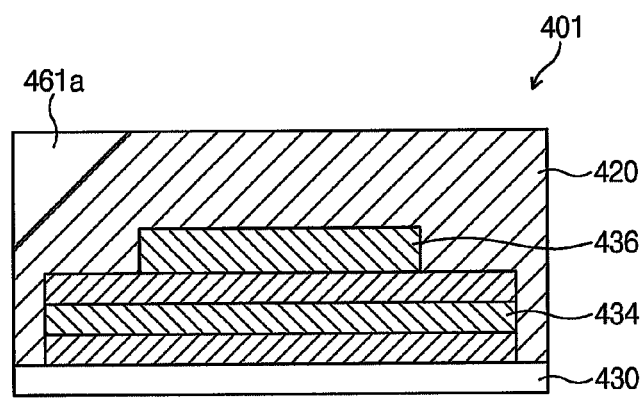
FIGS. 9 and 10 are a front view and a top view for illustrating memory chips and a controller chip of the memory card of FIG. 8.
Figure 10:
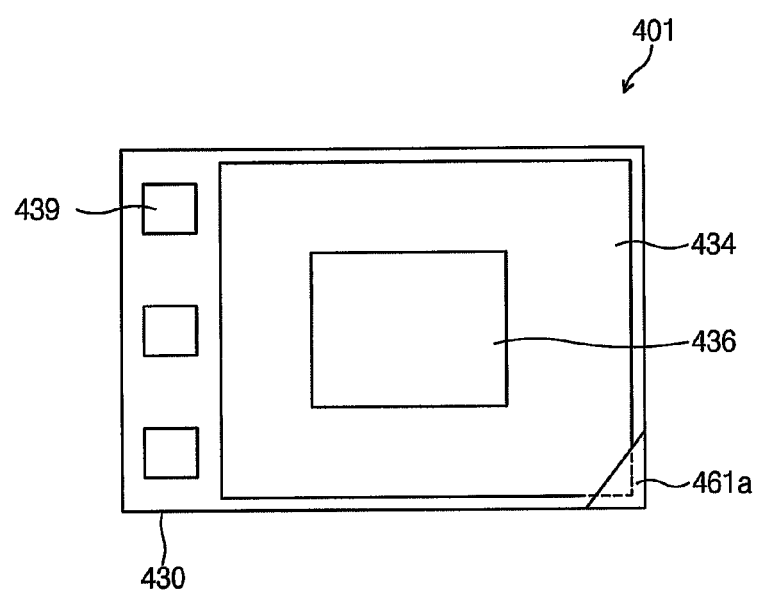

FIGS. 8 through 10 illustrate a memory card 401. FIG. 8 is a top perspective view illustrating the memory card 401, and FIGS. 9 and 10 are a front view and a top view of the memory card 401 of FIG. 8, respectively, for illustrating memory chips 434 and a controller chip 436 of the memory card 401. The memory card 401 has a shape similar to that of the memory card 400 illustrated in FIGS. 6 and 7. However, as shown in FIG. 8, a chamfer 461a is formed from a top side 441 of the memory card 401 to a predetermined depth of the memory card 401. For example, the predetermined depth may be half the thickness of the memory card 401 when the thickness of a protrusion 412 is not included in the thickness of the memory card 401. Alternatively, the predetermined depth may be smaller than half the thickness of the memory card 401 when the thickness of a protrusion 412 is not included in the thickness of the memory card 401. As shown in FIG. 9, the memory card 401 includes a mold member 420, a circuit board 430 and passive components 439.

As described above, the controller chip 436 may be smaller than the memory chips 434. In this case, when the memory chips 434 are viewed from the top side, the memory chips 434 may be partially overlapped with the chamfer 461a, and when the controller chip 436 is viewed from the top side, the controller chip 436 may be located outside the chamfer 461a. In addition, when the memory chips 434 are viewed from the first lateral side 445, the memory chips 434 may be overlapped with the chamfer 461a. Owing to this, the memory chips 434 having a relatively big size can be disposed in the memory card 401 which includes the chamfer 461a and has a limited size.

Figure 39:
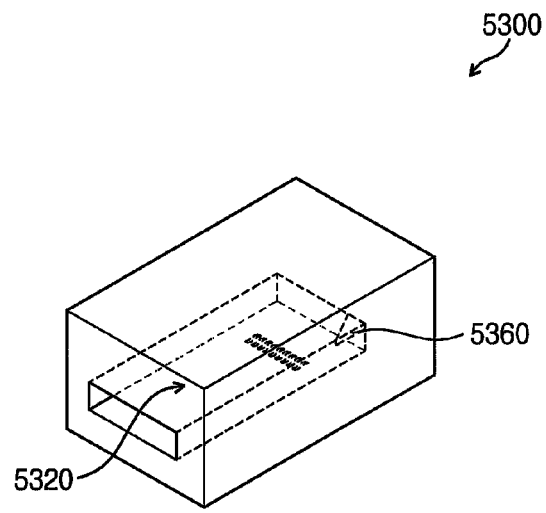
FIG. 39 is a perspective view illustrating an electronic machine according to an example embodiment that can be used with the memory card of FIG. 8.

The chamfer (461, 461a) may prevent reverse insertion when a user inserts the memory card (400, 401) into a socket of an electronic machine. For example, the memory card 401 of FIG. 8 may be used with an electronic machine 5300 (refer to FIG. 39) which includes a protrusion 5360 (refer to FIG. 39) corresponding to the chamfer 461a in a socket 5320 (refer to FIG. 39).

Figure 11:
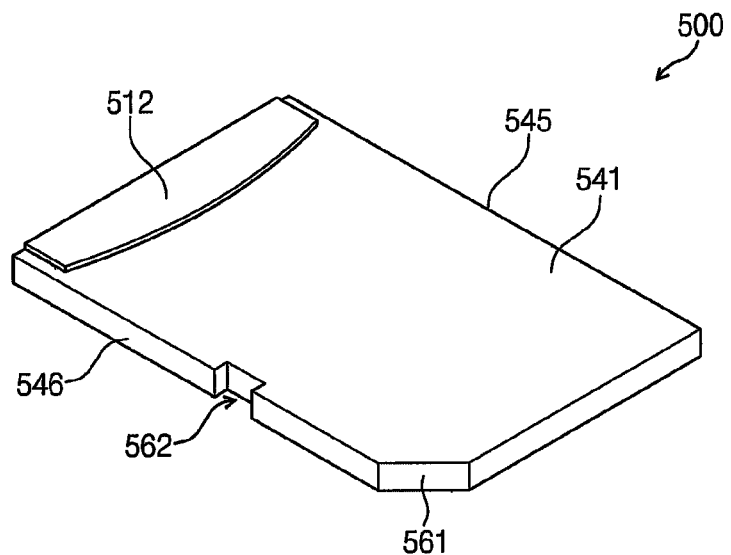
FIG. 11 is a top perspective view illustrating another example embodiment of the memory card of FIG. 1.
Figure 12:
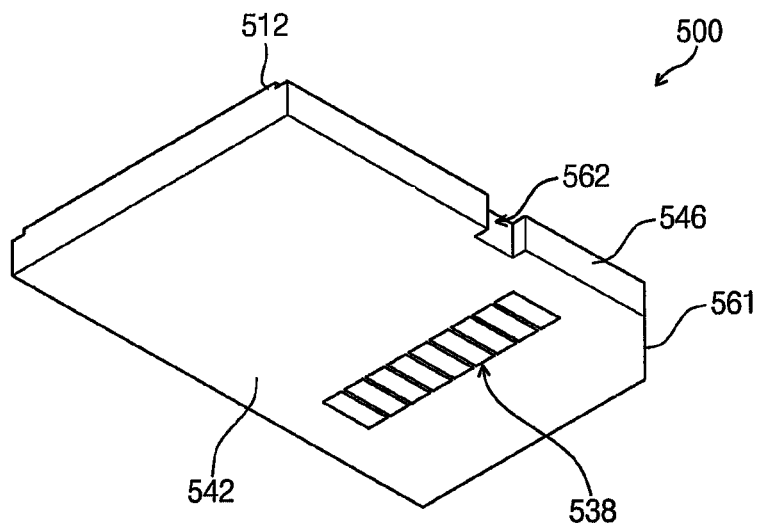
FIG. 12 is a bottom perspective view illustrating the memory card of FIG. 11.

FIGS. 11 and 12 illustrate a memory card 500. FIG. 11 is a top perspective view illustrating the memory card 500, and FIG. 12 is a bottom perspective view illustrating the memory card 500. The memory card 500 may have a thin parallelepiped shape similar to that of the memory card 200 illustrated in FIGS. 1 through 3. Interconnection terminals 538 of the memory card 500 may be similar in position to the interconnection terminals 238 of the memory card 200 illustrated in FIGS. 1 through 3. A protrusion 512, which is similar to the protrusion 312 of the memory card 300 of FIG. 4, may be disposed on a top side 541 of the memory card 500. However, the protrusion 512 of the memory card 500 may be provided on the top side 541 from a region close to a first lateral side 545 to a region close to a second lateral side 546. A chamfer 561, which is similar to the chamfer 461 of the memory card 400 of FIG. 6, may be provided at a corner of the memory card 500. In addition, the memory card 500 includes a notch 562 in a second lateral side 546. The notch 562 may be disposed approximately at the center of the second lateral side 546. The notch 562 may extend from a top side 541 to a bottom side 542 of the memory card 500. Alternatively, the notch 562 may be formed in the first lateral side 545, or notches may be formed in the first and second lateral sides 545 and 546, respectively.

Figure 13:
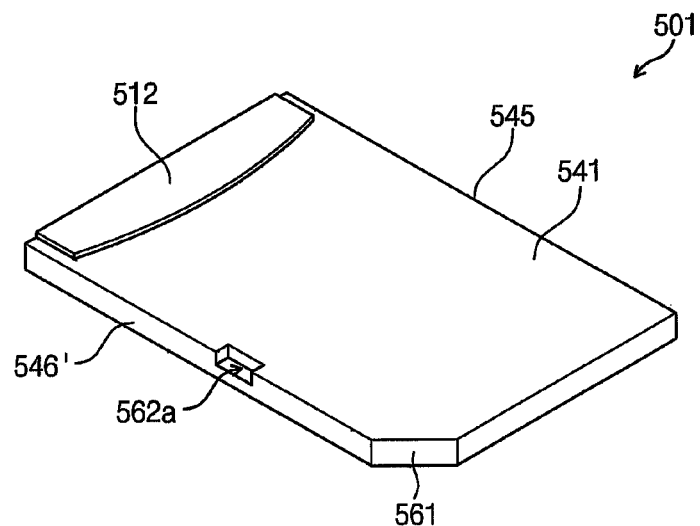
FIG. 13 is a bottom perspective view illustrating another example embodiment of the memory card of FIG. 1.

FIG. 13 illustrates a memory card 501. FIG. 13 is a top view of the memory card 501. The memory card 501 has a shape similar to the shape of the memory card 500 illustrated in FIGS. 11 and 12. However, a notch 562a is formed from a top side 541 to a predetermined depth of the memory card 501. For example, the predetermined depth may be half the thickness of the memory card 501 when the thickness of a protrusion 512 is not included in the thickness of the memory card 501. Alternatively, the predetermined depth may be smaller than half the thickness of the memory card 501 when the thickness of the protrusion 512 is not included in the thickness of the memory card 501.

Although not shown in FIG. 13, in the memory card 501, memory chips may be partially overlapped with the notch 562a when the memory chips are viewed from the top side, and a controller chip may be located outside the notch 562a when the controller chip is viewed from the top side. In addition, when the controller chip is viewed from a second lateral side 546', the controller chip may be partially overlapped with the notch 562a.

Figure 14:
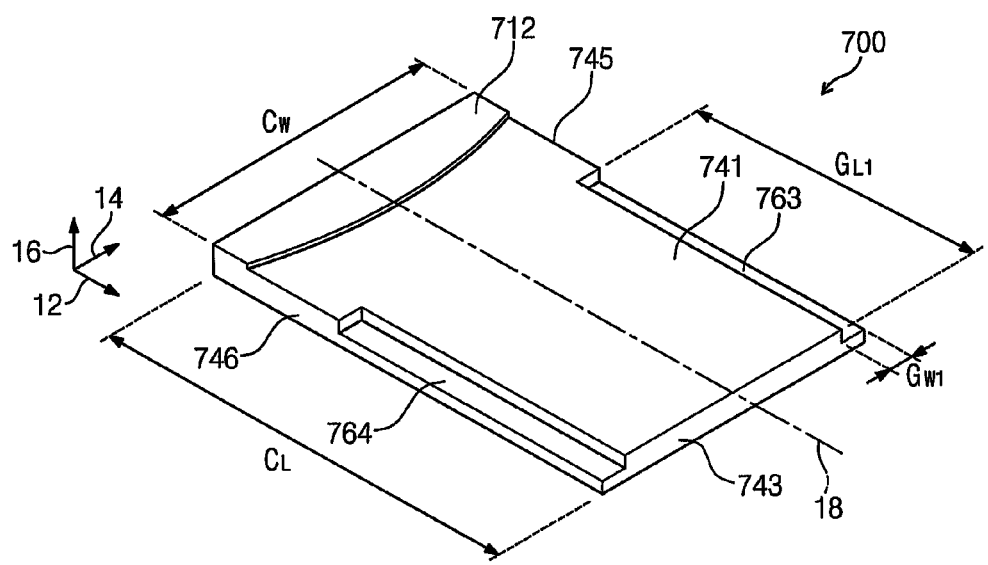
FIG. 14 is a top perspective view illustrating another example embodiment of the memory card of FIG. 1.
Figure 15:
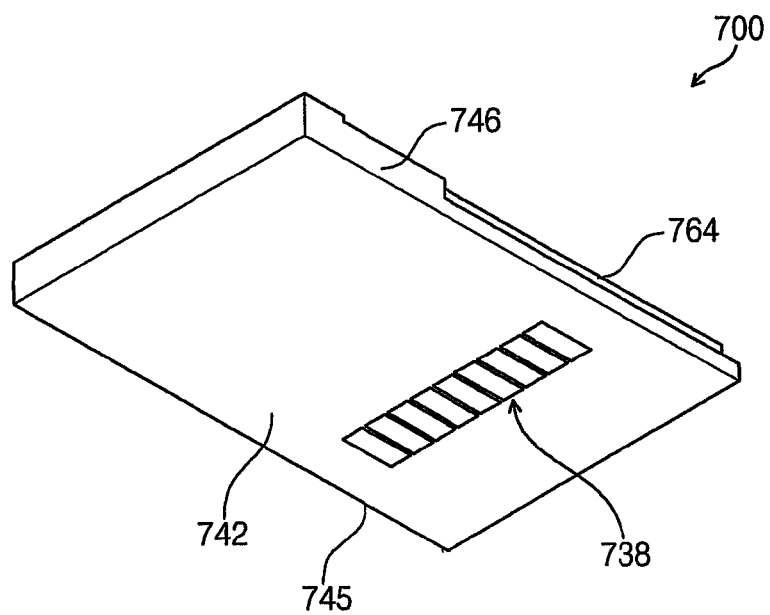
FIG. 15 is a bottom perspective view illustrating the memory card of FIG. 13.
Figure 16:
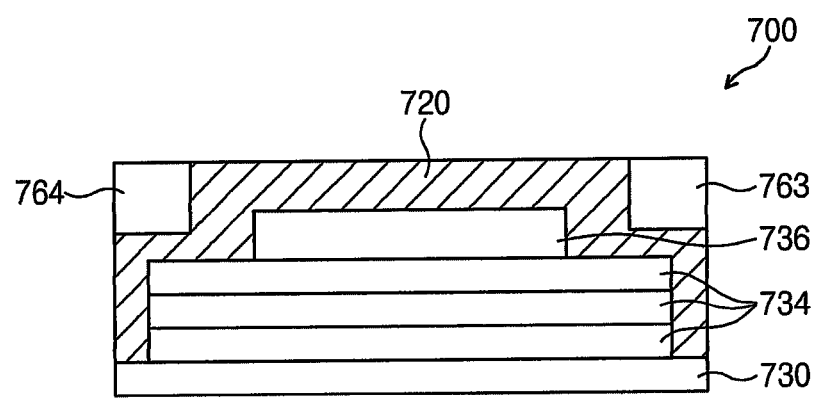
FIGS. 16 and 17 are a front view and a top view for illustrating memory chips and a controller chip of the memory card of FIG. 14.

FIGS. 14 to 17 illustrate a memory card 700. FIG. 14 is a top perspective view illustrating the memory card 700, and FIG. 15 is a bottom perspective view illustrating the memory card 700. In addition, FIGS. 16 and 17 are a front view and a top view of the memory card 700 for illustrating memory chips 734 and a controller chip 736. The memory card 700 may have a thin parallelepiped shape similar to that of the memory card 200 illustrated in FIGS. 1 through 3. Interconnection terminals 738 of the memory card 700 may be similar in position to the interconnection terminals 238 of the memory card 200 illustrated in FIGS. 1 through 3. A protrusion 712, which is similar to the protrusion 312 of the memory card 300 of FIG. 4, may be disposed on a top side 741 of the memory card 700. A first groove 763 may be formed in a region of the top side 741 of the memory card 700 close to a first lateral side 745, and a second groove 764 may be formed in a region of the top side 741 close to a second lateral side 746. The longitudinal direction of the first groove 763 may be parallel to the first direction 12. The first groove 763 may have a constant width $G_{W1}$ in its longitudinal direction. An end of the first groove 763 may extend to a front side 743 of the memory card 700. A length $G_{L1}$ of the first and second grooves 763, 764 may be about ¼ to about ¾ a length $C_L$ of the memory card 700. For example, the length $G_{L1}$ may be about ½ the length $C_L$ of the memory card 700. In addition, a lateral side of the first groove 763 may extend to the first lateral side 745. The width $G_{W1}$ of the first groove 763 may be about 1/20 to about 1/10 of the width $C_W$ of the memory card 700. For example, the width $G_{W1}$ of the first groove 763 may be about 1/12 the width $C_W$ of the memory card 700. The first groove 763 may extend from the top side 741 of the 700 to a predetermined depth. For example, the predetermined depth may be about ½ the thickness of the memory card 700. The first and second grooves 763 and 764 may be symmetric with respect to an imaginary line 18 passing through the center of the memory card 700 and approximately parallel with the first lateral side 745.

As described above, the controller chip 736 may be smaller than the memory chips 734. In this case, when the memory chips 734 are viewed from the top side, the memory chips 734 may be partially overlapped with the grooves 763 and 764, and when the controller chip 736 is viewed from the top side, the controller chip 736 may be disposed outside the grooves 763 and 764. In addition, when the controller chip 736 is viewed from the first lateral side 745, the controller chip 736 may be partially overlapped with the grooves 763 and 764. The memory chips 734 having a relatively big size can be disposed in the memory card 700 although the memory card 700 includes the grooves 763 and 764 and has a limited size.

Alternatively, only one of the first and second grooves 763 and 764 may be formed in the memory card 700. In addition, the first and second grooves 763 and 764 may extend from the top side 741 to a bottom side 742 of the memory card 700.

In the above example, ends of the grooves 763 and 764 extend to the front side 743, and the other ends of the grooves 763 and 764 extend to positions spaced apart from a rear side 744. However, alternatively, ends of the grooves 763 and 764 may extend to the front side 743, and the other ends of the grooves 763 and 764 may extend to the rear side 744.

Furthermore, in the above example, outer sides of the grooves 763 and 764 extend to the first lateral side 745 and the second lateral side 746. However, alternatively, the outer sides of the grooves 763 and 764 may extend to positions spaced inward from the first lateral side 745 and the second lateral side 746.

Figure 40:
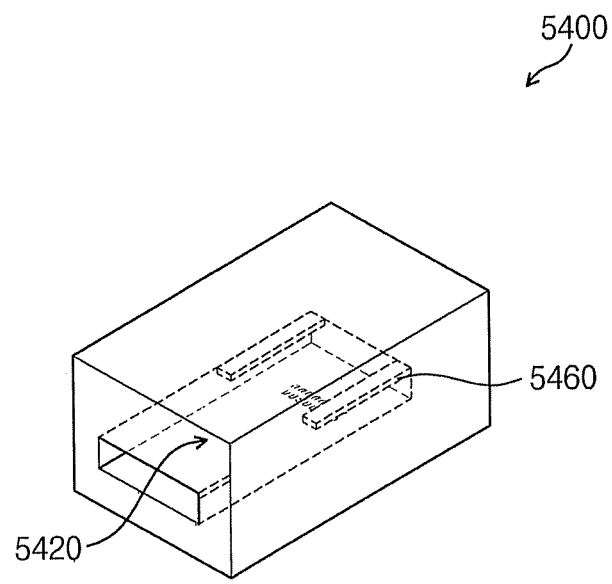
FIG. 40 is a perspective view illustrating an electronic machine according to an example embodiment that can be used with the memory card of FIG. 14.

Grooves 763 and 764 may prevent reverse insertion when a user inserts the memory card 700 into a socket of an electronic machine. For example, the memory card 700 of FIG. 14 may be used with an electronic machine 5400 (refer to FIG. 40) which includes protrusions 5460 (refer to FIG. 40) corresponding to the grooves 763 and 764 in a socket 5420 (refer to FIG. 40). As shown in FIG. 16, the memory card 700 also includes a mold member 720 and a circuit board 730.

Figure 18:
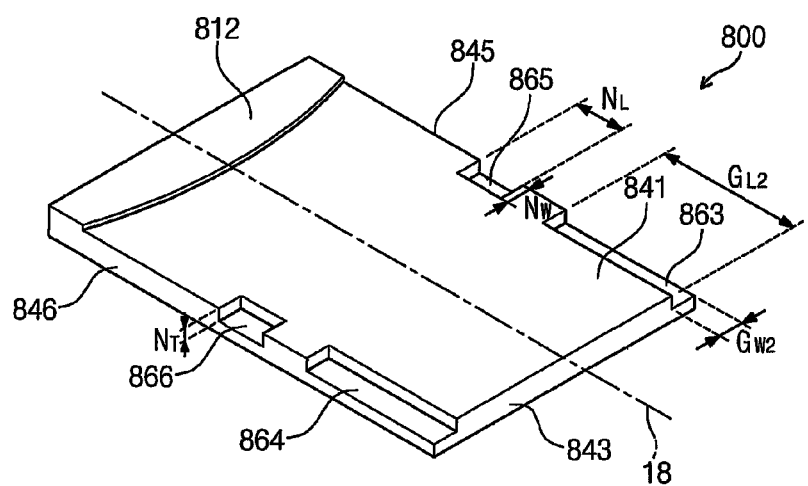
FIG. 18 is a top perspective view illustrating another example embodiment of the memory card of FIG. 1.
Figure 19:
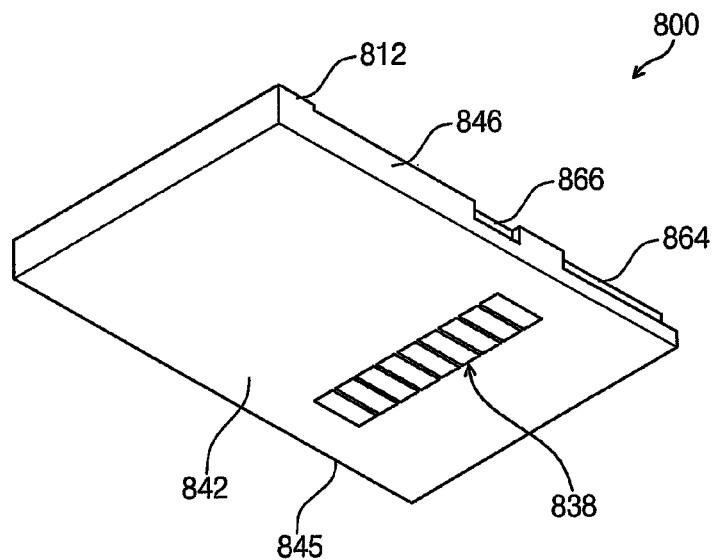
FIG. 19 is a bottom perspective view illustrating the memory card of FIG. 18.

FIGS. 18 and 19 illustrate a memory card 800. FIG. 18 is a top perspective view illustrating the memory card 800, and FIG. 19 is a bottom perspective view illustrating the memory card 800. The memory card 800 may have a thin parallelepiped shape similar to that of the memory card 200 illustrated in FIGS. 1 through 3. Interconnection terminals 838 of the memory card 800 may be similar in position to the interconnection terminals 238 of the memory card 200 illustrated in FIGS. 1 through 3. A protrusion 812, which is similar to the protrusion 312 of the memory card 300 of FIG. 4, may be disposed on a top side 841 of the memory card 800. First and second grooves 863 and 864 may be formed in both lateral sides 845, 846 of the memory card 800 like the first and second grooves 763 and 764 of the memory card 700 illustrated in FIGS. 14 and 15. In addition, a first notch 865 may be formed in a first lateral side 845. The length $G_{L2}$ of the first groove 863 of the memory card 800 may be smaller than that of the first groove 763 of the memory card 700 illustrated in FIGS. 14 and 15. The first groove 863 may extend to a front side 843, and the length $G_{L2}$ of the first groove 863 may be shorter than about ½ the length $C_L$ of the memory card 800. For example, the length $G_{L2}$ of the first groove 863 may be about ¼ to about ⅜ the length $C_L$ of the memory card 800. The first notch 865 may be disposed at a center part of the first lateral side 845 of the memory card 800. A width $N_W$ of the first notch 865 may be equal to a width $G_{W2}$ of the first groove 863. The length $N_L$ of the first notch 865 may be about ⅛ to about ⅙ the length $G_{L2}$ of the first groove 863. The first notch 865 may extend from the top side 841 to a predetermined depth. For example, the thickness $N_T$ of the first notch 865 may be equal to the thickness $G_T$ of the first groove 863. For example, the predetermined depth of the first lateral side 845 may be about ½ the thickness of the memory card 800 not including the thickness of the protrusion 812. In addition, a second groove 864 and a second notch 866 may be formed in a second lateral side 864. The second lateral side 864 and the second notch 866 are symmetric to the first groove 863 and the first notch 865 with respect to an imaginary line 18 passing through the center of the memory card 800 and approximately parallel with the first lateral side 845. The first notch 865 is spaced a predetermined distance from the first groove 863 in the first direction 12.

Alternatively, only one of the first and second grooves 863 and 864 may be formed in the memory card 800. In addition, the first and second grooves 863 and 864 may extend from the top side 841 to a bottom side 842 of the memory card 800. In addition, only one of the first and second notches 865 and 866 may be formed in the memory card 800. The protrusion 812 may not be provided on the top side 841 of the memory card 800. In addition, the first notch 865 may extend from the top side 841 to the bottom side 842 of the memory card 800.

Figure 20:
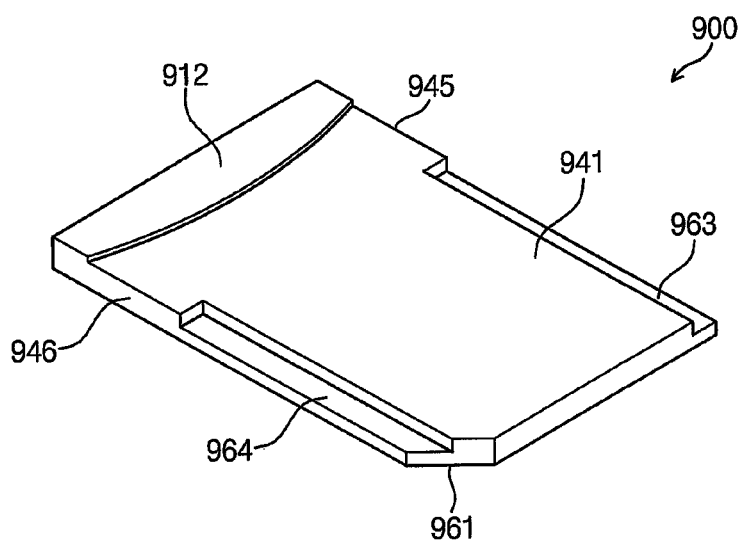
FIG. 20 is a top perspective view illustrating another example embodiment of the memory card of FIG. 1.
Figure 21:
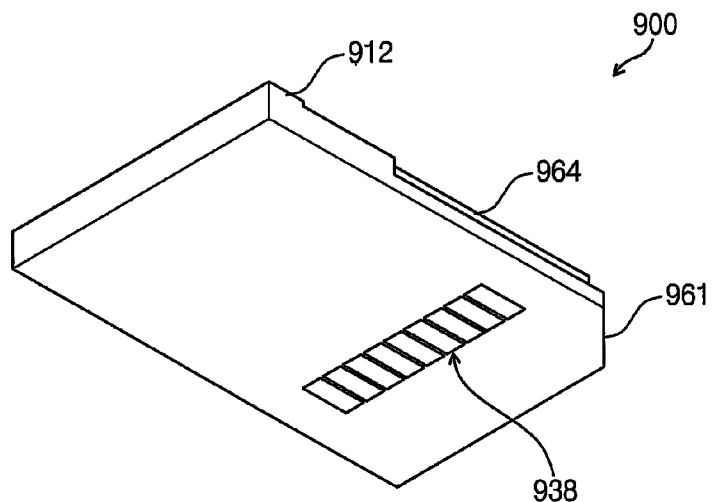
FIG. 21 is a bottom perspective view illustrating the memory card of FIG. 20.

FIGS. 20 and 21 illustrate a memory card 900. FIG. 20 is a top perspective view illustrating the memory card 900, and FIG. 21 is a bottom perspective view illustrating the memory card 900. The memory card 900 may have a thin parallelepiped shape similar to that of the memory card 200 illustrated in FIGS. 1 through 3. Interconnection terminals 938 of the memory card 900 may be similar in position to the interconnection terminals 238 of the memory card 200 illustrated in FIGS. 1 through 3. A protrusion 912, which is similar to the protrusion 312 of the memory card 300 of FIG. 4, may be disposed on a top side 941 of the memory card 900. First and second grooves 963 and 964 may be formed in both lateral sides 945 and 946 of the memory card 900 like the first and second grooves 763 and 764 of the memory card 700 illustrated in FIGS. 14 and 15. In addition, a chamfer 961, which is similar to the chamfer 461 of the memory card 400 of FIG. 6, may be provided at a corner of the memory card 900. Alternatively, the chamfer 961 may be similar to the chamfer 461a of FIG. 8.

Figure 22:
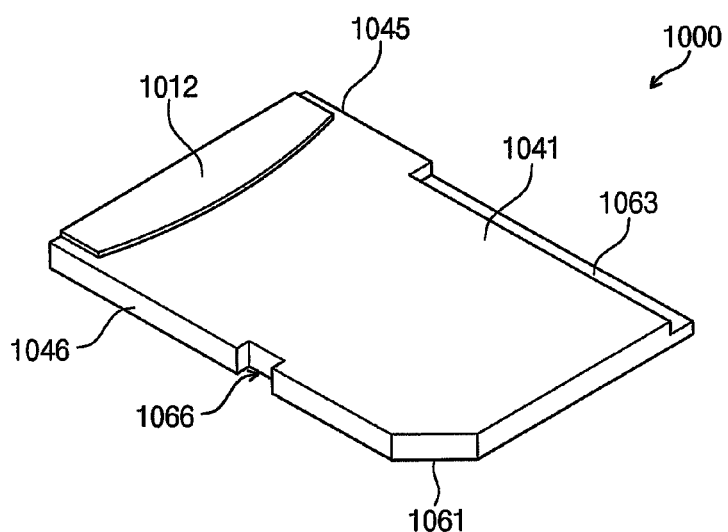
FIG. 22 is a top perspective view illustrating another example embodiment of the memory card of FIG. 1.
Figure 23:
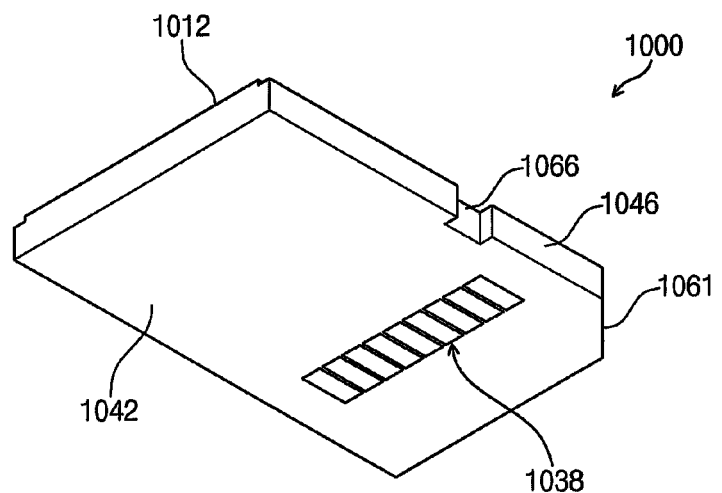
FIG. 23 is a bottom perspective view illustrating the memory card of FIG. 22.

FIGS. 22 and 23 illustrate a memory card 1000. FIG. 22 is a top perspective view illustrating the memory card 1000, and FIG. 23 is a bottom perspective view illustrating the memory card 1000 including a bottom side 1042. The memory card 1000 may have a thin parallelepiped shape similar to that of the memory card 200 illustrated in FIGS. 1 through 3. Interconnection terminals 1038 of the memory card 1000 may be similar in position to the interconnection terminals 238 of the memory card 200 illustrated in FIGS. 1 through 3. A protrusion 1012, which is similar to the protrusion 312 of the memory card 300 of FIG. 4, may be disposed on a top side 1041 of the memory card 1000. In addition, a chamfer 1061, which is similar to the chamfer 461 of the memory card 400 of FIG. 6, may be provided at a corner of the memory card 1000. A groove 1063 may be formed in a first lateral side 1045 of the memory card 1000 like the first groove 763 of the memory card 700 illustrated in FIGS. 14 and 15. A notch 1066 may be formed in a second lateral side 1046 of the memory card 1000 like the second notch 562 of the memory card 500 illustrated in FIG. 11.

Figure 24:
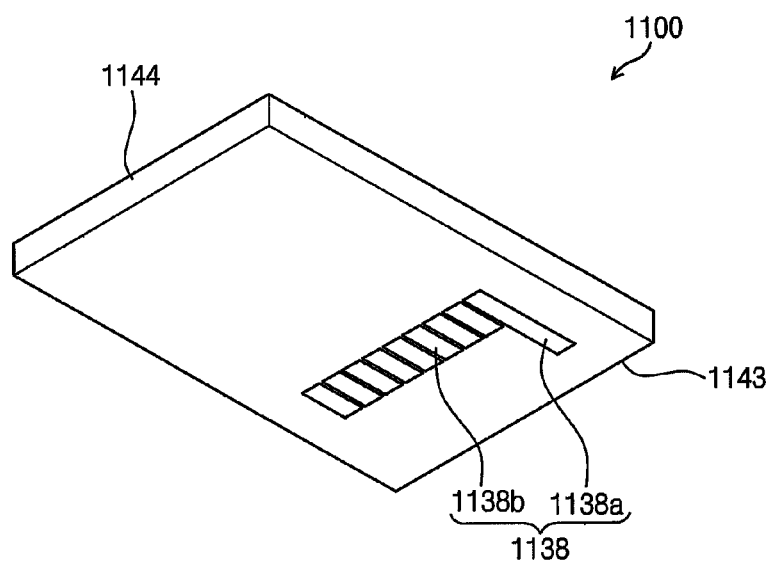
FIG. 24 is a bottom perspective view illustrating another example embodiment of the memory card of FIG. 1.

FIG. 24 illustrates a memory card 1100. FIG. 24 is a bottom perspective view illustrating the memory card 1100. The memory card 1100 may have a thin parallelepiped shape similar to that of the memory card 200 illustrated in FIGS. 1 through 3. The memory card 1100 includes interconnection terminals 1138, and one or more interconnection terminals 1138a of the interconnection terminals 1138 may be longer than other terminals 1138b. For example, the interconnection terminal 1138a may be a power terminal which is two or more times longer than the other terminals 1138b. Ends of the interconnection terminals 1138 facing a rear side 1144 may be arranged along the same line, and the other end of the power terminal 1138a may be closer to a front side 1143 than the other ends of the other terminals 1138b. For example, the interconnection terminal 1138a may be a power terminal 1138a. In another example, a plurality of interconnection terminals 1138a may be provided, and the interconnection terminals 1138a may be power terminals.

Figure 25:
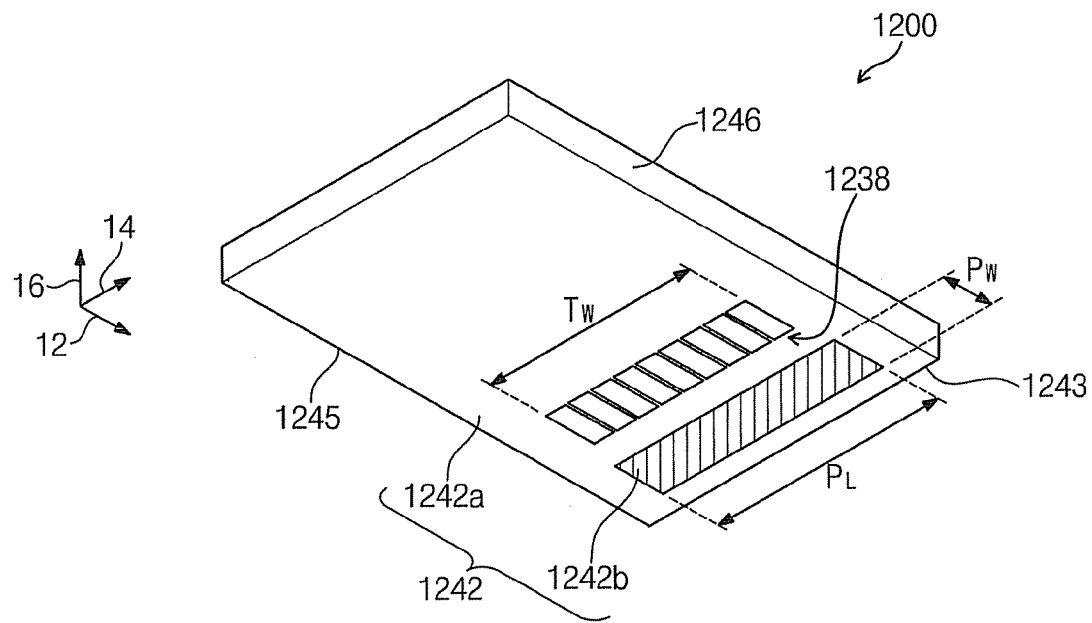
FIG. 25 is a bottom perspective view illustrating another example embodiment of the memory card of FIG. 1.

FIG. 25 illustrates a memory card 1200. FIG. 25 is a bottom perspective view illustrating the memory card 1200. The memory card 1200 may have a thin parallelepiped shape similar to that of the memory card 200 illustrated in FIGS. 1 through 3. A protection region 1242b may be provided on a bottom side 1242 of the memory card 1200 between a front side 1243 and interconnection terminals 1238. The protection region 1242b may be formed of a material different from a material used to form another region 1242a of the bottom side 1242. The protection region 1242b may be formed of a material that causes less damage to interconnection terminals of an electronic machine (such as interconnection terminals 5140b of the electronic machine 5100 of FIG. 36) when the memory card 1200 makes contact with the interconnection terminals 5140b, as compared with a material used to form the other region 1242a. The protection region 1242b may have an approximately rectangular shape. The longitudinal direction of the protection region 1242b may be parallel with the second direction 14. A length $P_L$ of the protection region 1242b may be sufficiently large to cover a width $T_W$ of the interconnection terminals 1238. For example, the protection region 1242b may extend from a position close to a first lateral side 1245 to a position close to a second lateral side 1246. Alternatively, the protection region 1242b may extend from the first lateral side 1245 to the second lateral side 1246. The width $P_W$ of the protection region 1242b may be greater than the lengths of the respective interconnection terminals 1238. The protection region 1242b may be disposed at a position corresponding to interconnection terminals of a different memory card (such as the interconnection terminals 5162 of the memory card 5160 of FIG. 37) having a size similar to that of the memory card 1200 of the current embodiment. For example, the different memory card 5160 may be the above-described micro secure digital card.

In the above-described examples, the interconnection terminals are arranged on the bottom side of the memory card close to the front side of the memory card in parallel to the second direction 14. However, the interconnection terminals may be arranged on the bottom side of the memory card close to the rear side of the memory card. In addition, the interconnection terminals may not be parallel with the second direction 14. In addition, the interconnection terminals may be arranged on the top side of the memory card.

Figure 26:
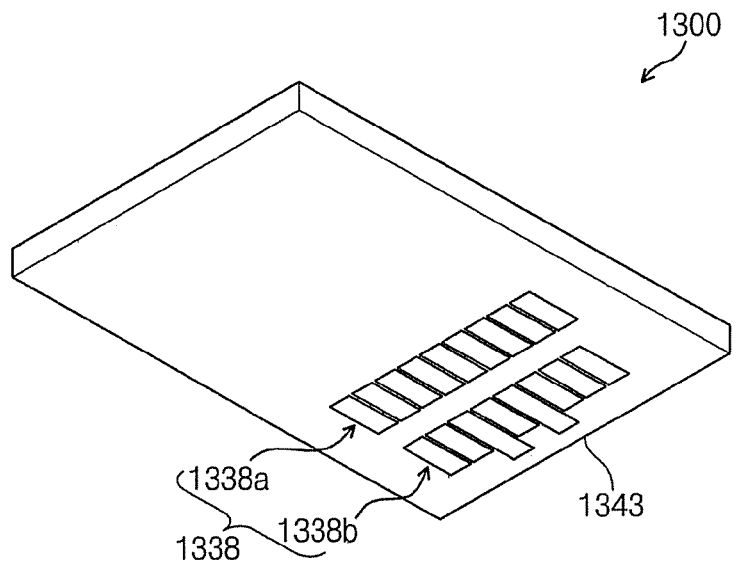
FIG. 26 is a bottom perspective view illustrating another example embodiment of the memory card of FIG. 1.

FIG. 26 is a perspective view illustrating a memory card 1300 according to another example embodiment of inventive concepts. FIG. 26 is a bottom perspective view illustrating the memory card 1300. The memory card 1300 may have a thin parallelepiped shape similar to that of the memory card 200 illustrated in FIGS. 1 through 3. The memory card 1300 includes a plurality of sets of interconnection terminals 1338. For example, the memory card 1300 may include two sets of interconnection terminals 1338. For example, interconnection terminals 1338 of the memory card 1300 corresponding to the interconnection terminals 238 of the memory card 200 illustrated in FIGS. 1 through 3 will now be referred to as a first set of interconnection terminals 1338a, and the other interconnection terminals 1338 will be referred to a second set of interconnection terminals 1338b.

The number of the first set of interconnection terminals 1338a may be different from the number of the second set of interconnection terminals 1338b. For example, the number of the first set of interconnection terminals 1338a may be nine, and the number of the second set of interconnection terminals 1338b may be eight. In this case, the first set of interconnection terminals 1338a may further include a pin dedicated for I/O. The pin dedicated for I/O may be closest to a first lateral side. Alternatively, the number of the first set of interconnection terminals 1338a may be equal to the number of the second set of interconnection terminals 1338b.

Figure 27:
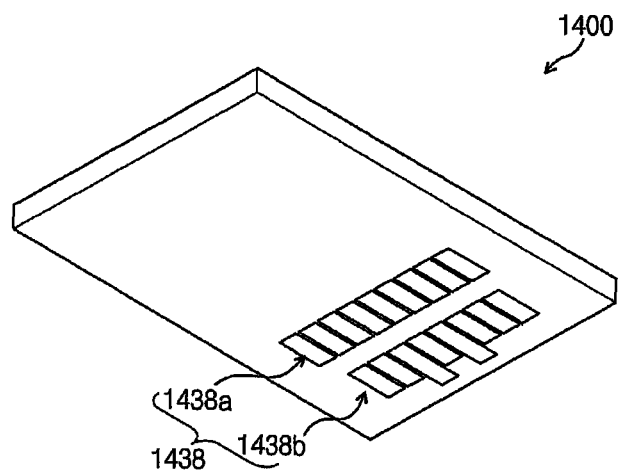
FIG. 27 is a bottom perspective view illustrating another example embodiment of the memory card of FIG. 1.

The second set of interconnection terminals 1338b is disposed between a front side 1343 and the first set of interconnection terminals 1338a. For example, the region where the second set of interconnection terminals 1338b are disposed may correspond to a region where interconnection terminals of a different memory card (such as the interconnection terminals 5162 of the memory card 5160 of FIG. 37) having a size similar to that of the memory card 1300 are disposed. For example, the different memory card 5160 may be the above-described micro secure digital card. The number of the second set of interconnection terminals 1338b may be equal to the number of the first set of interconnection terminals 1338a, and the second set of interconnection terminals 1338b may be arranged in the same intervals as the first set of interconnection terminals 1338a. In this case, the second set of interconnection terminals 1338b may be aligned with the first set of interconnection terminals 1338a, respectively, as shown in FIG. 26. Alternatively, interconnection terminals 1438 may be staggered. For example, a first set of interconnection terminals 1438a and a second set of interconnection terminals 1438b of a memory card 1400 may be staggered, as shown in FIG. 27.

The first set of interconnection terminals 1338a and the second set of interconnection terminals 1338b may be used for different electronic machines. The first set of interconnection terminals 1338a may be inserted into a socket of a first electronic machine for electric connection with the first electronic machine, and the second set of interconnection terminals 1338b may be inserted into a socket of a second electronic machine for electric connection with the second electronic machine.

The first and second electronic machines may be used for different purposes. Each of the first and second electronic machines may include a socket into which a memory card can be fully inserted. The first and second electronic machines may be used with different memory cards, and the number, sizes, and arrangement of interconnection terminals provided at the socket of the first electronic machine may be different from the number, sizes, and arrangement of interconnection terminals provided at the socket of the second electronic machine.

Figure 28:
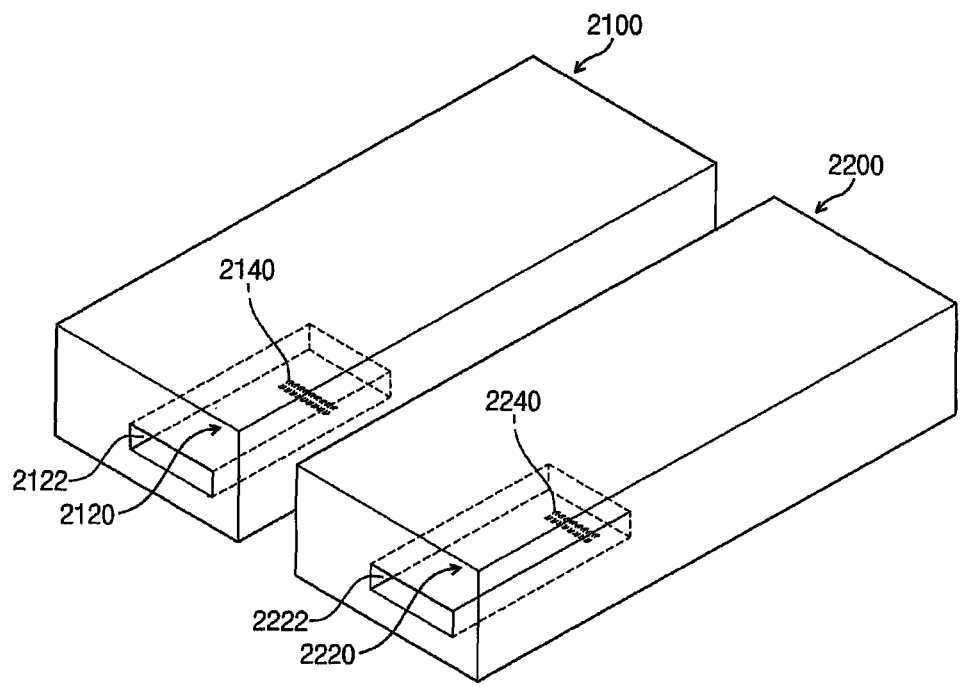
FIG. 28 is a schematic perspective view illustrating electronic machines according to example embodiments that can be used with the memory card of FIG. 26.

FIG. 28 illustrates an example first electronic machine 2100 and an example second electronic machine 2200. The first electronic machine 2100 may be one of devices such as a computer, a digital camera, a digital camcorder, a cellular phone, and a personal digital assistant (PDA), and the second electronic machine 2200 may be another of the devices. Alternatively, the first and second electronic machines 2100 and 2200 may be the same kind of electronic machines. For example, the first and second electronic machines 2100 and 2200 may be cellular phones.

The first and second electronic machines 2100 and 2200 may include sockets 2120 and 2220 having similar sizes. Interconnection terminals 2140 and 2240 are provided at the sockets 2120 and 2220 for electric connection with external memory cards (such as the memory card 1300 illustrated in FIG. 26). For example, the interconnection terminals 2140 and 2240 may be provided at the bottom sides of the sockets 2120 and 2220. The distance between the interconnection terminals 2140 of the socket 2120 and an inlet 2122 of the socket 2120 of the first electronic machine 2100 is shorter than the distance between the interconnection terminals 2240 of the socket 2220 and an inlet 2222 of the socket 2220 of the second electronic machine 2200. In this case, if the memory card 1300 (refer to FIG. 26) is inserted into the socket 2120 of the first electronic machine 2100, the first set of interconnection terminals 1338a is electrically connected to the interconnection terminals 2140 of the first electronic machine 2100. In addition, if the memory card 1300 (refer to FIG. 26) is inserted into the socket 2220 of the second electronic machine 2200, the second set of interconnection terminals 1338b is electrically connected to the interconnection terminals 2240 of the second electronic machine 2200.

Figure 29:
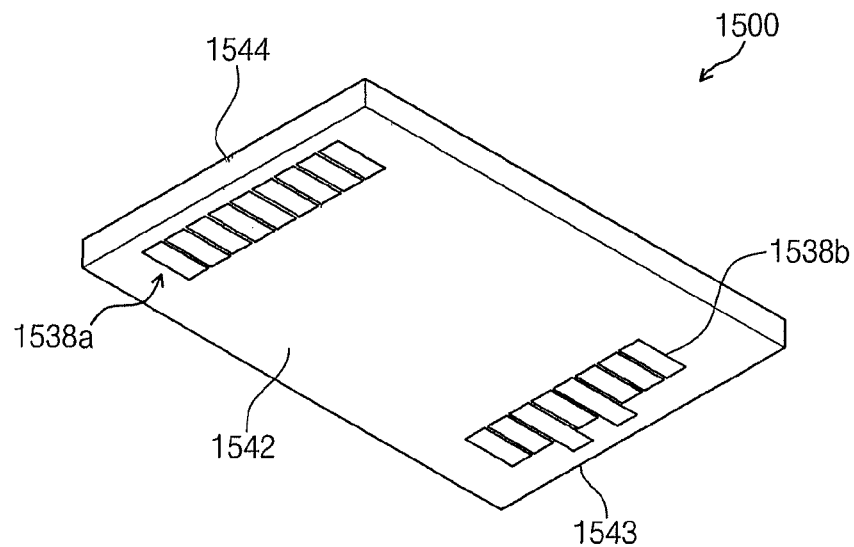
FIG. 29 is a bottom perspective view illustrating another example embodiment of the memory card of FIG. 1.

FIG. 29 illustrates another example memory card 1500. FIG. 29 is a bottom perspective view illustrating the memory card 1500. The memory card 1500 may have a thin parallelepiped shape similar to that of the memory card 200 illustrated in FIGS. 1 through 3. The memory card 1500 includes a plurality of interconnection terminals 1538a and 1538b. For example, the memory card 1500 may include a first set of interconnection terminals 1538a and a second set of interconnection terminals 1538b. The first set of interconnection terminals 1538a of the memory card 1500 may be disposed in a region of a bottom side 1542 close to a rear side 1544 of the memory card 1500. The second set of interconnection terminals 1538b of the memory card 1500 may be disposed in a region of the bottom side 1542 close to a front side 1543 of the memory card 1500.

Figure 30:
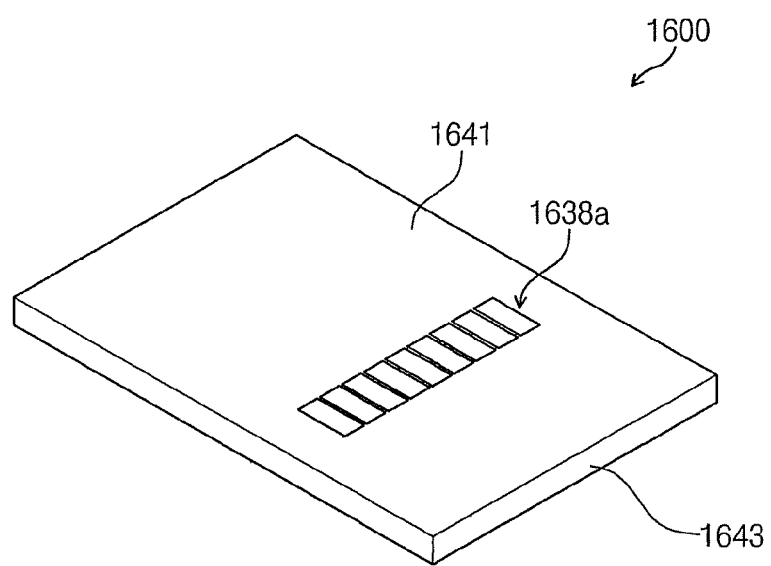
FIG. 30 is a top perspective view illustrating another example embodiment of the memory card of FIG. 1.
Figure 31:
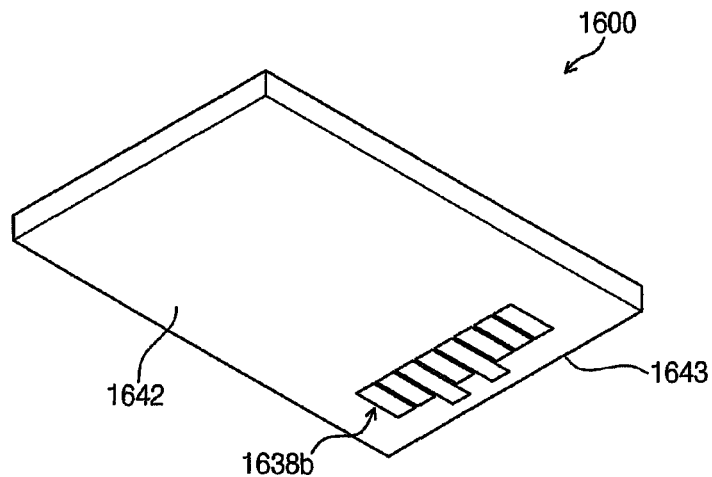
FIG. 31 is a bottom perspective view illustrating the memory card of FIG. 30.

FIGS. 30 and 31 illustrate a memory card 1600. FIG. 30 is a top perspective view illustrating the memory card 1600, and FIG. 31 is a bottom perspective view illustrating the memory card 1600. The memory card 1600 may have a thin parallelepiped shape similar to that of the memory card 200 illustrated in FIGS. 1 through 3. The memory card 1600 includes a plurality of interconnection terminals 1638a and 1638b. For example, the memory card 1600 may include first and second sets of interconnection terminals 1638a and 1638b. The first set of interconnection terminals 1638a may be disposed on a top side 1641 of the memory card 1600, and the second set of interconnection terminals 1638b may be disposed on a bottom side 1642 of the memory card 1600. For example, the first set of interconnection terminals 1638a may be disposed in a region of the top side 1641 close to a front side 1643 of the memory card 1600, and the second set of interconnection terminals 1638b may be disposed in a region of the bottom side 1642 close to the front side 1643 of the memory card 1600.

In the memory card 1300, 1400, 1500, and 1600 of FIGS. 26, 27, 29 and 30, one set of the first set of interconnection terminals 1338a, 1438a, 1538a and 1638a and the second set of interconnection terminals 1338b, 1438b, 1538b and 1638b may be covered with a protection layer. The protection layer may be solder resist or other material. For example the protection layer may be epoxy compound or epoxy tape.

Figure 32:
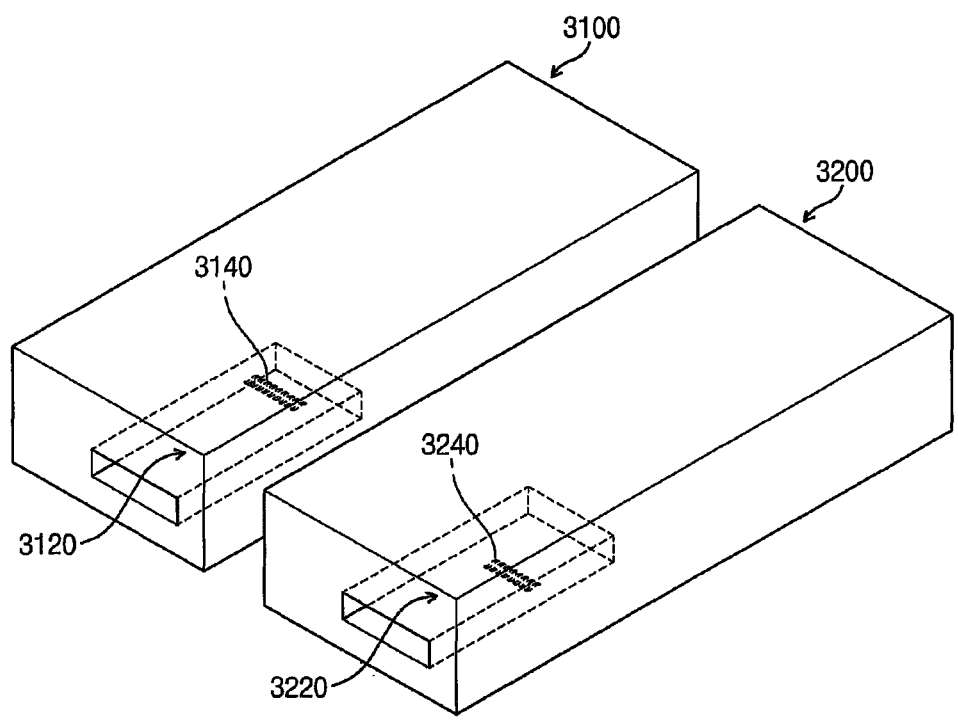
FIG. 32 is a schematic perspective view illustrating electronic machines according to example embodiments that can be used with the memory card of FIG. 30.

Referring to FIG. 32, a first electronic machine 3100 includes a socket 3120, and interconnection terminals 3140 are provided on a top side of the socket 3120. A second electronic machine 3200 includes a socket 3220, and interconnection terminals 3240 are provided on a bottom side of the socket 3220. The memory card 1600 can be used with both the first electronic machine 3100 and the second electronic machine 3200.

In the above-described examples, the memory cards illustrated in FIGS. 25, 26, 27, 29, and 30 have a shape similar to that of the memory card illustrated in FIGS. 1 through 3. However, the memory cards may have a shape similar to any one of the shapes of the memory cards illustrated in FIGS. 4, 6, 8, 11, 13, 14, 18, 20, and 22. That is, the memory cards illustrated in FIGS. 25, 26, 27, 29, and 30 may include one or more of the protrusion 312 or 612, the chamfer 461 or 461a, the notch 562, 562a, 865, 866, or 1066, the first groove 763 or 863, and the second groove 764 or 864.

Figure 33:
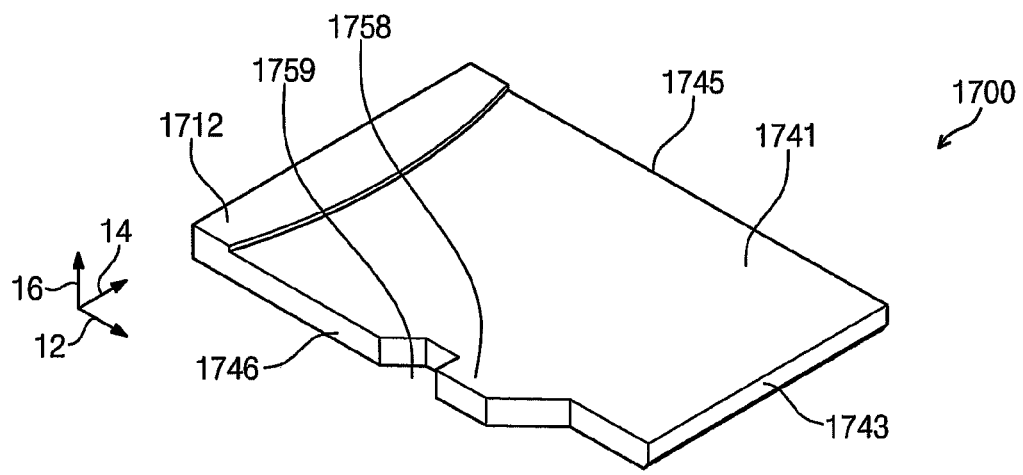
FIG. 33 is a top perspective view illustrating another example embodiment of the memory card of FIG. 1.
Figure 34:
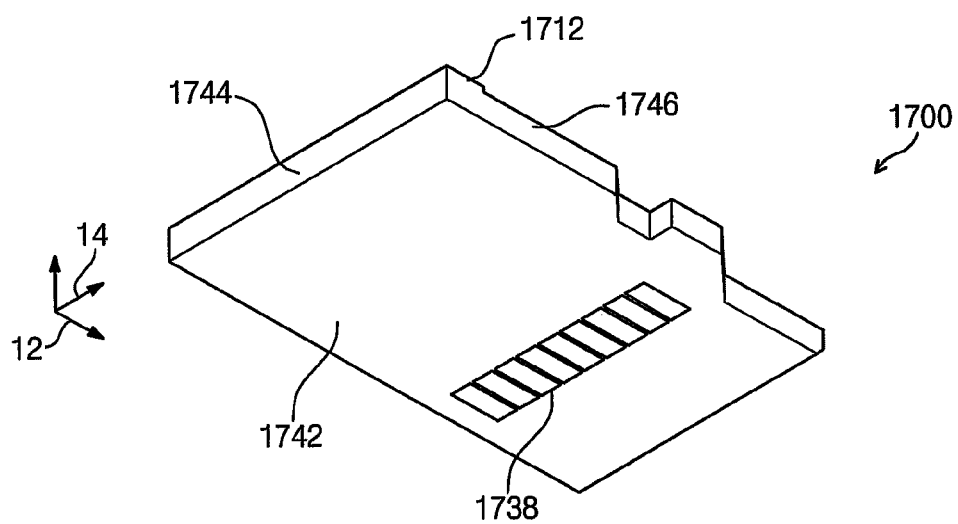
FIG. 34 is a bottom perspective view illustrating the memory card of FIG. 33.

FIGS. 33 and 34 illustrate a memory card 1700. FIG. 33 is a top perspective view illustrating the memory card 1700, and FIG. 34 is a bottom perspective view illustrating the memory card 1700. The memory card 1700 may have a thin parallelepiped shape similar to that of the memory card 300 illustrated in FIGS. 4 and 5. However, a convex part 1758 and a concave part 1759 are disposed on a second lateral side 1746 (opposite a first lateral side 1745) of the memory card 1700. The convex part 1758 may be disposed close to the concave part 1759. The convex part 1758 may be closer to a front side 1743 than the concave part 1759. As shown, the memory card 1700 includes a top side 1741 and a protrusion 1712.

Figure 35:
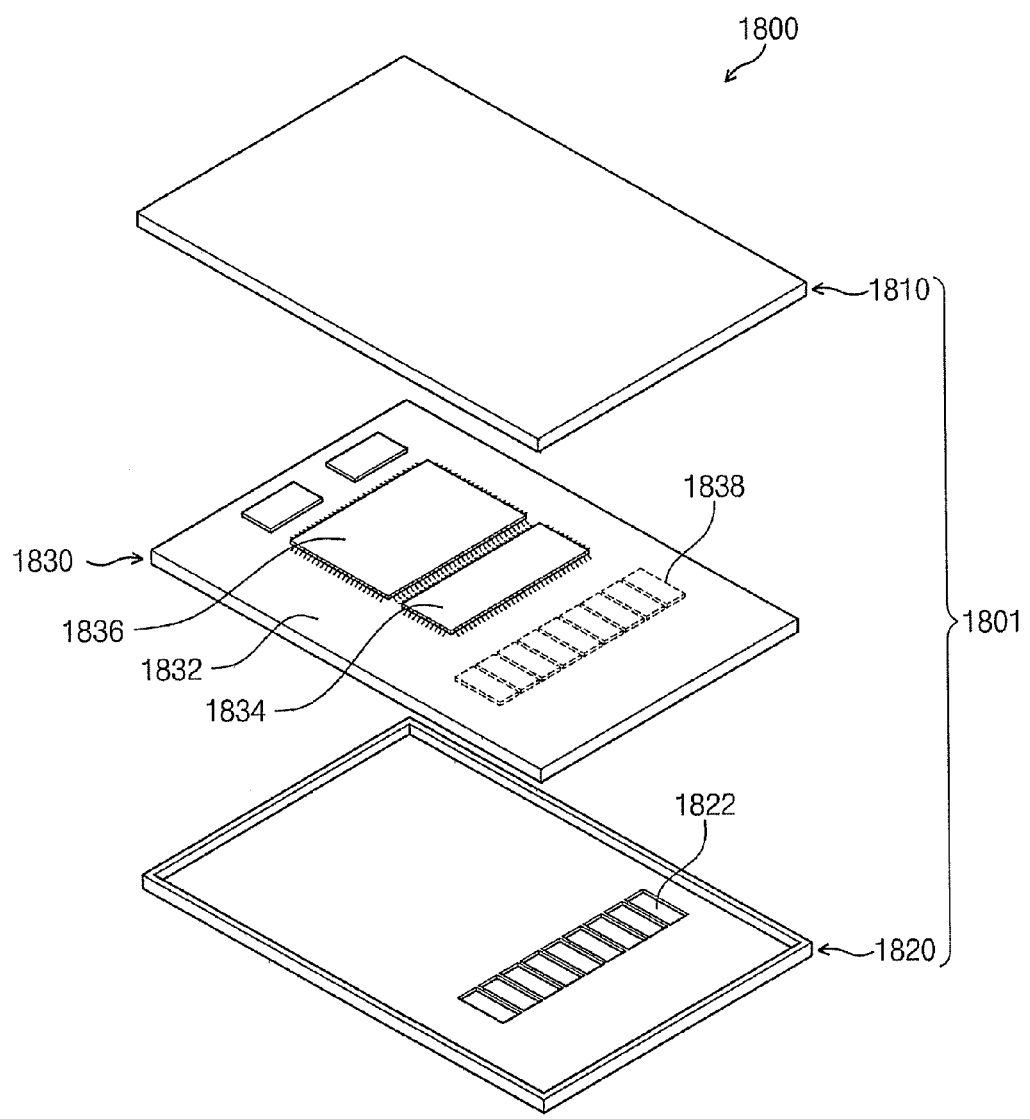
FIG. 35 is an exploded perspective view illustrating another example embodiment of the memory card of FIG. 1.

FIG. 35 is an exploded perspective view illustrating another example memory card 1800. In the above-described examples, it has explained that the memory cards 200 through 1700 are fabricated in a way of enclosing a circuit board on which semiconductor chips are mounted by a molding method. However, instead of this, the memory card 1800 may be fabricated by inserting a circuit board 1830 on which semiconductor chips 1834 and 1836 (e.g., controller and memory chips) are mounted in a case 1801. For example, the case 1801 includes an upper cover 1810 and a lower cover 1820. The upper cover 1810 faces the top side of the circuit board 1830, and the lower cover 1820 faces the bottom side of the circuit board 1830. When the upper cover 1810 and the lower cover 1820 are coupled, an accommodation space is formed inside the upper cover 1810 and the lower cover 1820 so that the circuit board 1830 can be accommodated. The lower cover 1820 is shaped in a manner such that interconnection terminals 1838 of the circuit board 1830 can be exposed to the outside of the case 1801. For example, openings 1822 having sizes and shapes corresponding to those of the interconnection terminals 1838 may be formed in the lower cover 1820 at positions corresponding to the positions of the interconnection terminals 1838 of the circuit board 1830.

Figure 36:
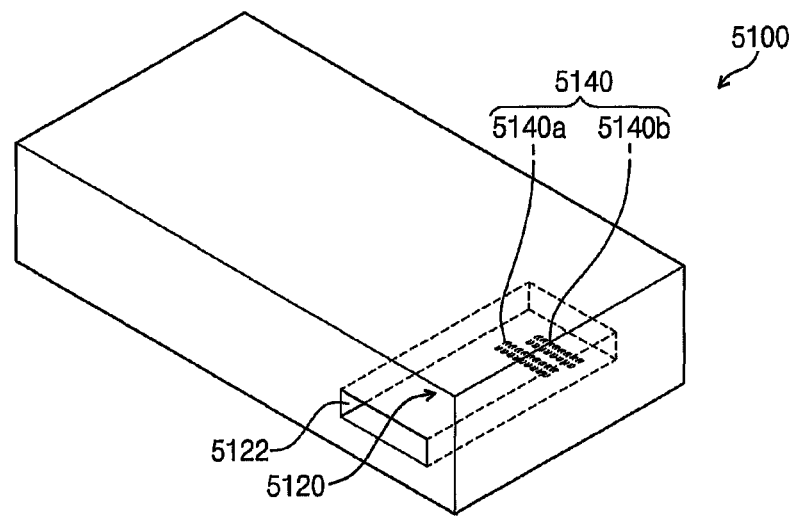
FIG. 36 is a schematic perspective view illustrating an electronic machine according to an example embodiment of inventive concepts.

FIG. 36 is a perspective view illustrating an electronic machine 5100 according to an example embodiment of inventive concepts. The electronic machine 5100 may be electrically connected with an external memory card (such as a memory card 5150 or 5160 illustrated in FIG. 37) for storing data such as photo data, voice data, video data, or other information in the memory card 5150 or 5160 and reading such data from the memory card 5150 or 5160. For example, the electronic machine 5100 may be a computer, a digital camera, a digital camcorder, a cellular phone, or a PDA. The electronic machine 5100 includes a body and a socket 5120.

The socket 5120 may be provided at the outer side of the body so that the socket 5120 can be directly exposed to the outside of the electronic machine 5100. An inlet 5122 of the socket 5120 may be closed or opened by a cover (not shown) provided at the body. The socket 5120 includes an accommodation space for receiving the memory card 5150 or 5160. For example, the accommodation space may have a sufficient volume to receive the memory card 5150 or 5160 fully.

The socket 5120 includes a plurality of sets of interconnection terminals 5140. For example, the socket 5120 may include first and second sets of interconnection terminals 5140*a* and 5140*b*. The first set of interconnection terminals 5140*a* and the second set of interconnection terminals 5140*b* may be electrically connected with different kinds of memory cards. For example, the first set of interconnection terminals 5140*a* are disposed at positions such that when the (first) memory card 5150 is inserted into the accommodation space of the socket 5120, the first set of interconnection terminals 5140*a* can be electrically connected to interconnection terminals 5152 of the first memory card 5150; the second set of interconnection terminals 5140*b* are disposed at positions such that when the (second) memory card 5160 is inserted into the accommodation space of the socket 5120, the second set of interconnection terminals 5140*b* can be electrically connected to interconnection terminals 5162 of the second memory card 5160. The number, sizes, and arrangement of the interconnection terminals 5152 of the first memory card 5150 are different from the number, sizes, and arrangement of the interconnection terminals 5162 of the second memory card 5160.

For example, the first set of interconnection terminals 5140*a* and the second set of interconnection terminals 5140*b* are provided on a bottom side of the accommodation space of the socket 5120. The first set of interconnection terminals 5140*a* and the second set of interconnection terminals 5140*b* may be arranged in the same direction. The first set of interconnection terminals 5140*a* may be closer to the inlet 5122 than the second set of interconnection terminals 5140*b*.

Figure 37:
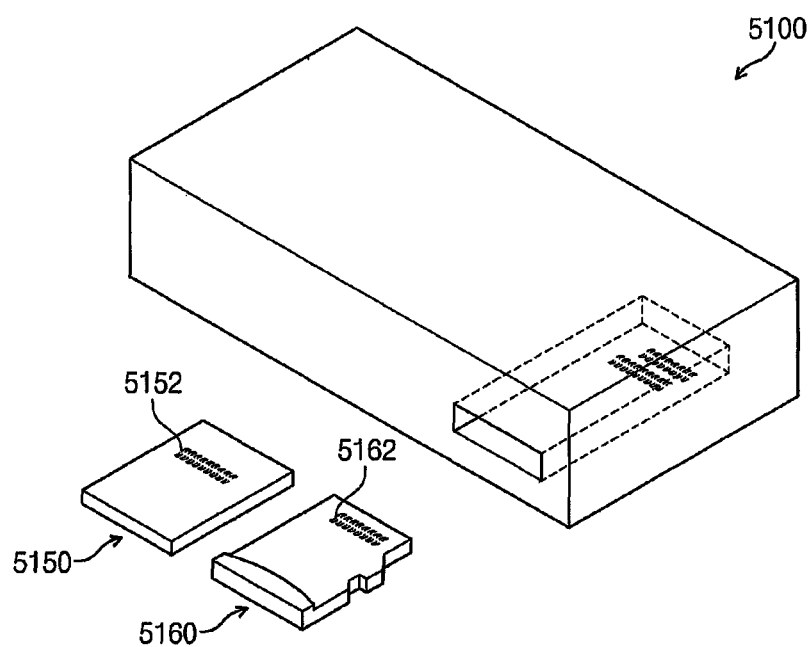
FIG. 37 is a perspective view illustrating memory cards according to example embodiments that can be used with the electronic machine of FIG. 36.

FIG. 37 illustrates an example usage of the electronic machine 5100 with the memory cards 5150 and 5160. For example, the second memory card 5160 may be the above-described micro secure digital card, and the first memory card 5150 may be a different kind of memory card. The first memory card 5150 may be an existing memory card or a new kind of memory card. For example, the first memory card 5150 may be the memory card illustrated in FIG. 1, 4, 6, 8, 11, 13, 14, 18, 20, or 22. When the memory card 5150 is inserted in the accommodation space, the first set of interconnection terminals 5140*a* of the socket 5120 of the electronic machine 5100 are electrically connected to the interconnection terminals 5152 of the first memory card 5150. In addition, when the second memory card 5160 is inserted in the accommodation space, the second set of interconnection terminals 5140*b* of the socket 5120 of the electronic machine 5100 are electrically connected to the interconnection terminals 5162 of the second memory card 5160. The first memory card 5150 may be larger than the second memory card 5160. Selectively the first memory card 5150 may be same size with the second memory card 5160.

Figure 38:
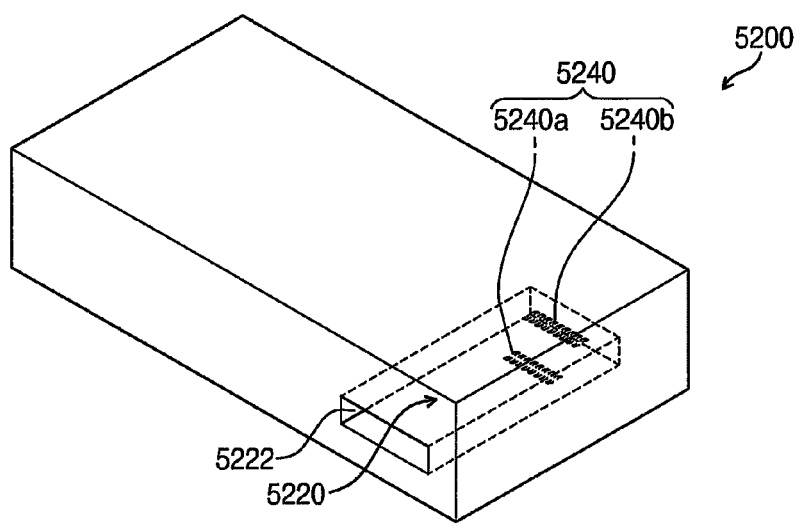
FIG. 38 is a schematic perspective view illustrating another example embodiment of the electronic machine of FIG. 36.

FIG. 38 illustrates another electronic machine 5200 including a plurality of interconnection terminals 5240. The electronic machine 5200 is similar to the electronic machine 5100 of FIG. 36. However, a first set of interconnection terminals 5240*a* is disposed on a top side of an accommodation space of a socket 5220, and a second set of interconnection terminals 5240*b* is disposed on a bottom side of the accommodation space of the socket 5220. As shown, the socket 5220 includes an inlet 5222.

Figure 41:
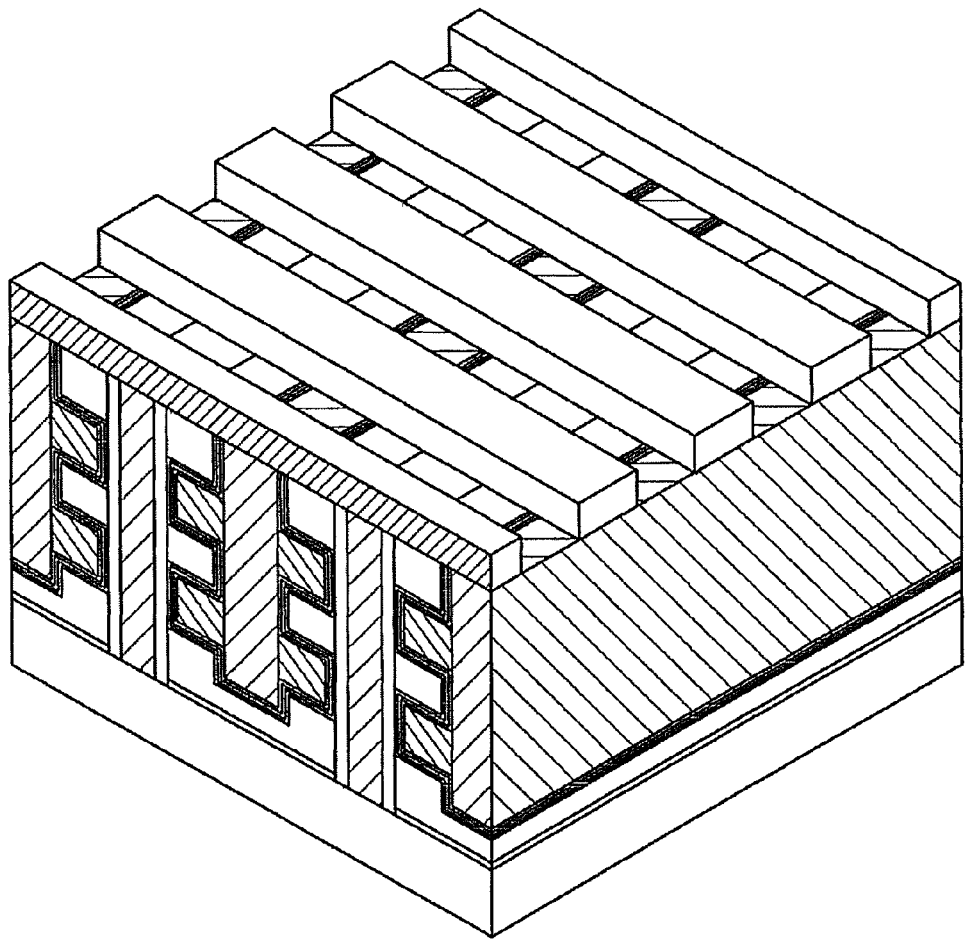
FIGS. 41 and 42 are views illustrating memory chips according to example embodiments that can be used in the above-described memory cards.
Figure 42:
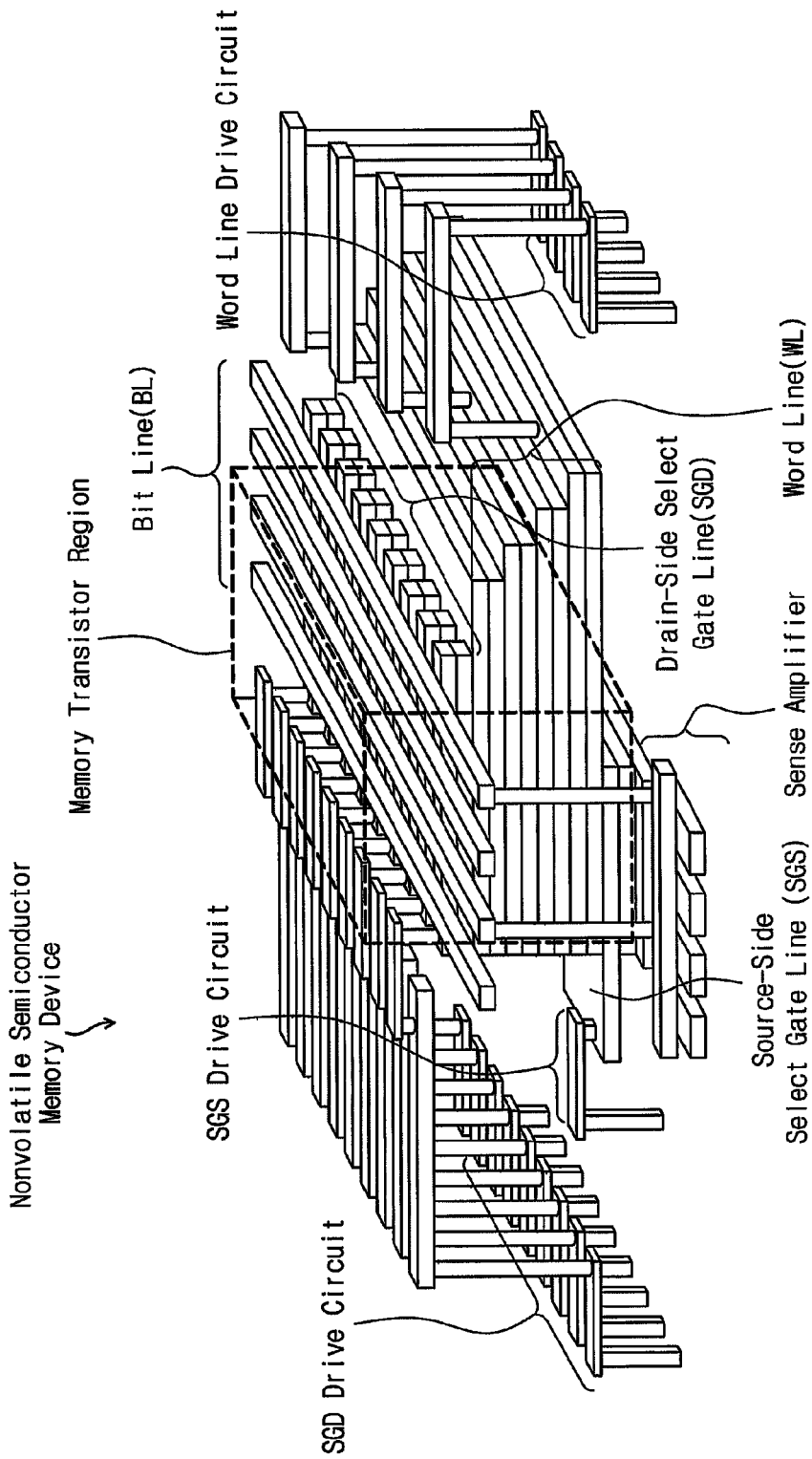

FIGS. 41 and 42 illustrate example three-dimensional (3D) memory chips that can be used in the above-described memory cards. The memory chips of FIGS. 41 and 42 are examples of memory devices disclosed in Korean Patent Application Publication Nos. 2009-93770 and 2007-96972, the entire contents of which are hereby incorporated by reference. The memory chips of the above-described embodiments may be vertical type memory devices disclosed in Korean Patent Application Publication No. 2009-93770 or nonvolatile semiconductor memory devices disclosed in Korean Patent Application Publication No. 2007-96972.

Figure 43:
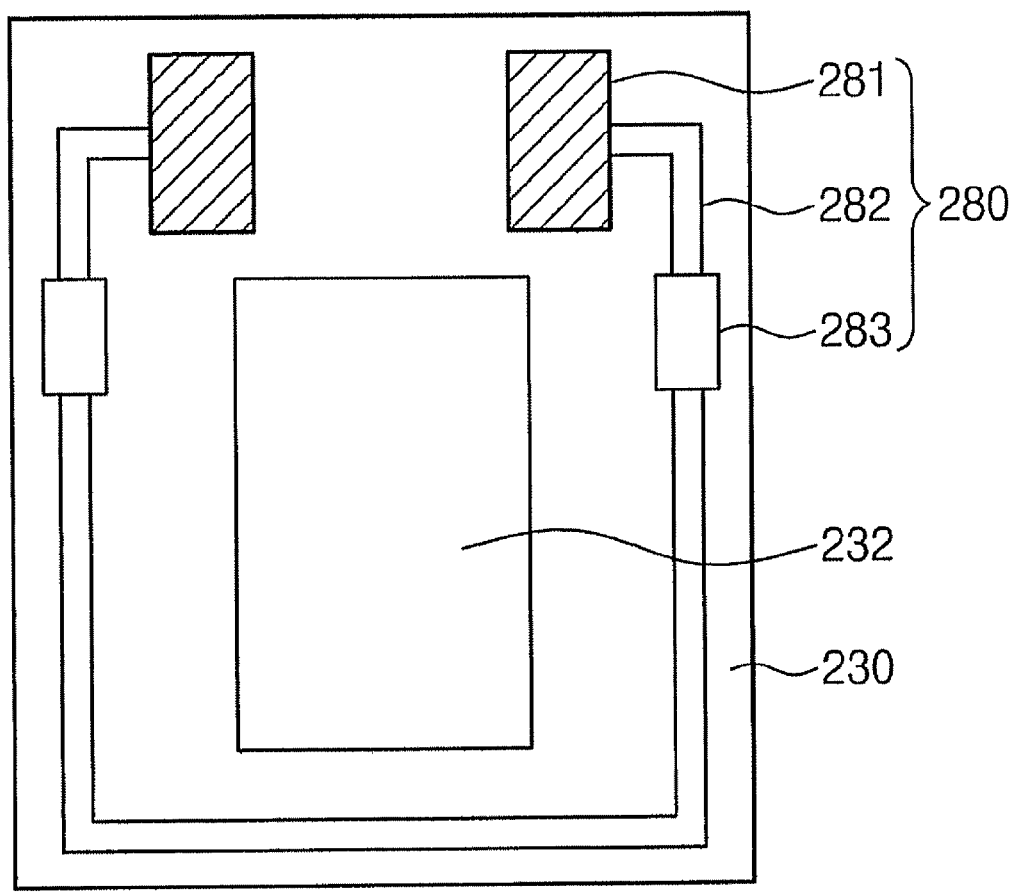
FIG. 43 is a schematic view illustrating a memory card according to example embodiments provided with a protector.

The memory cards of the above-described example embodiments may further include a protector to protect semiconductor chips from electrostatic discharge (ESD). FIG. 43 is a schematic view illustrating a memory card provided with a protector. In detail, FIG. 43 illustrates the case where a protector 280 is included in a memory card 200'. The memory card 200' is the same as the memory card 200 except that the memory card 200' includes the protector 280. It should be understood that the memory card 200' may be used in example embodiments instead of the memory card 200. Such a protector may be included in the memory cards of other example embodiments. Referring to FIG. 43, the protector 280 includes ground terminals 281, a protective pattern 282, and switching devices 283. The circuit board 230 may be divided into a first region, a second region, and a third region. The semiconductor chip 232 is mounted in the first region, and the ground terminals 281 are disposed in the second region. The protective pattern 282 is disposed in the third region to protect the semiconductor chip 232. For example, the first region may be a center region of the circuit board 230, the second region may be a side of the center region, and the third region may be a region disposed around the first region except for the second region.

Ends of the ground terminals 281 are connected to an external ground part, and the other ends of the ground terminals 281 are connected to the protective pattern 282. The ground terminals 281 may be connected to the ground part or the ground terminals 281 directly or through a conductive pattern. The number of the ground terminals 281 may be two, and both ends of the protective pattern 282 may be connected to the ground terminals 281, respectively. Although two ground terminals 281 are illustrated, the number of the ground terminals 281 may be changed. The ground terminals 281 may be formed of a conductive material. The conductive material may include a metal or metal compound. For example, the conductive material may be copper or a copper compound.

The protective pattern 282 is formed in the second region of the circuit board 230 and spaced a predetermined distance from the semiconductor chip 232. The protective pattern 282 is connected to the ground terminals 281. In the case where two ground terminals 281 are used, both ends of the protective pattern 282 may be connected to the ground terminals 281, respectively, in a loop shape surrounding the semiconductor chip 232. The protective pattern 282 may be formed of a conductive material. The conductive material may include a metal or metal compound. For example, the conductive material may be copper or a copper compound.

The switching devices 283 are connected in series between the ground terminals 281 and the protective pattern 282. For example, the switching devices 283 may be formed on the protective pattern 282 as shown in FIG. 43. In another example, the switching devices 283 may be directly connected to the ground terminals 281. In the current embodiment, the number of the switching devices 283 is two, and the ground terminals 281 are connected to both ends of the ground terminals 281 through the switching devices 283, respectively. Although two switching devices 283 are illustrated, the number of the switching devices 283 may be changed. In addition, the switching devices 283 may be disposed close to the ground terminals 281 to minimize the distances between the switching devices 283 and the ground terminals 281. In this case, when a spark generates in a high voltage state such as an electrostatic discharge state, a high-voltage current can rapidly flow to the ground terminals 281 through the protective pattern 282. The switching devices 283 may include one of a zener diode, an inductor, and a variable resistor (varistor).

Figure 44:
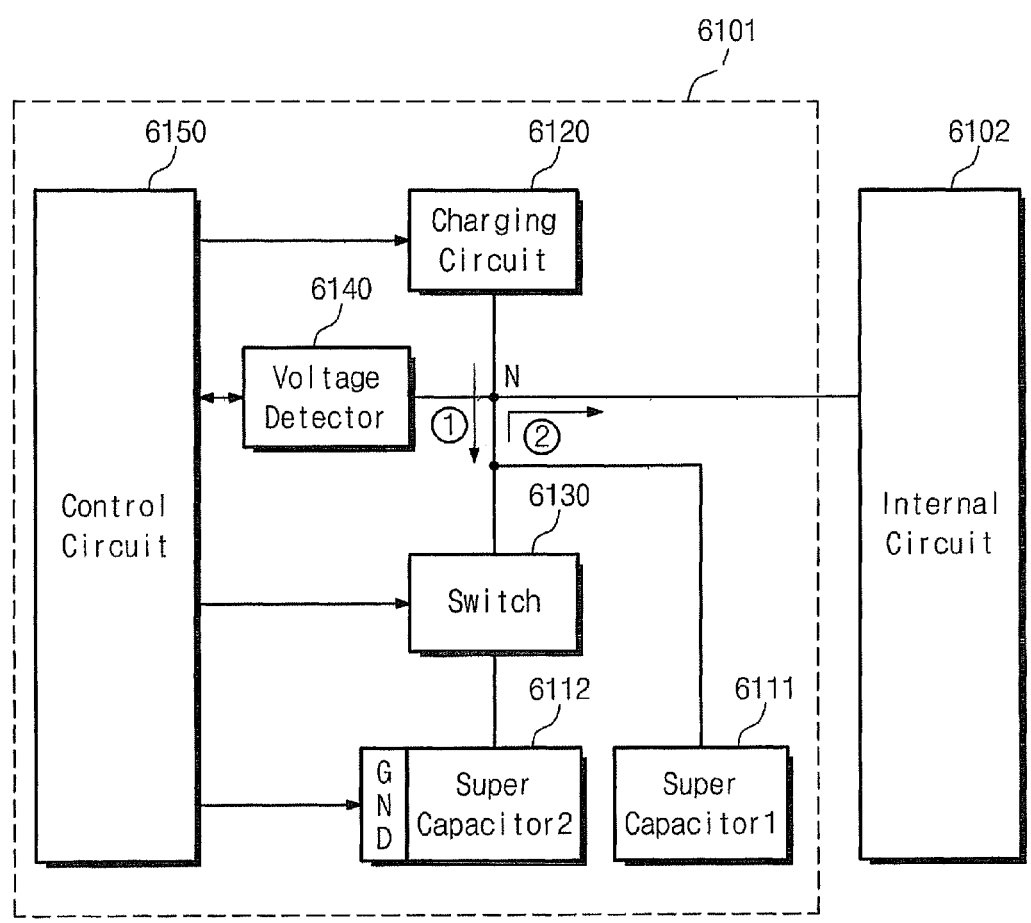
FIG. 44 is a schematic view illustrating a memory card provided with an auxiliary power supply.

The memory cards of the above-described example embodiments may further include an auxiliary power supply 6101 for stably performing a sudden power-off operation such as a data backup operation when a sudden power-off event occurs. FIG. 44 illustrates an example memory card including the auxiliary power supply 1601. Referring to FIG. 44, the auxiliary power supply 1601 includes a first super capacitor 6111, a second super capacitor 6112, a charging circuit 6120, a switch 6130, a voltage detector 6140, and a control circuit 6150.

The first and second super capacitors 6111 and 6112 may be power storage devices that can store high-capacity charges. The first and second super capacitors 6111 and 6112 may be charged when the memory card is powered up or operates in a normal state. The charges stored in the first and second super capacitors 6111 and 6112 may be supplied to an internal circuit 6102 as auxiliary power. The capacitances of the first and second super capacitors 6111 and 6112 may be decreased according to time. If the first super capacitor 6111 cannot be used due to a decrease of its capacitance, the sudden power-off operation of the memory card may be poorly carried out. In this case, the second super capacitor 6112 may supply auxiliary power, and thus the sudden power-off operation of the memory card may be normally carried out.

The auxiliary power of the first and second super capacitors 6111 and 6112 may be sequentially supplied. That is, if the first super capacitor 6111 cannot be used due to degradation, the second super capacitor 6112 is used. A ground circuit GND may be connected to the second super capacitor 6112. The ground circuit GND is used to discharge the second super capacitor 6112 while the first super capacitor 6111 is used. The charging circuit 6120 is used to charge the first super capacitor 6111 and the second super capacitor 6112. The charging circuit 6120 may include an internal power supply (not shown). In this case, the charging circuit 6120 may charge the first and second super capacitors 6111 and 6112 by using the internal power supply.

Alternatively, the charging circuit 6120 may charge the first and second super capacitors 6111 and 6112 by using power supplied from an external power supply (not shown). The charging circuit 6120 may supply a charging current to the first and second super capacitors 6111 and 6112 through a charging path ①. The switch 6130 is connected between the second super capacitor 6112 and the charging circuit 6120. The switch 6130 may be used to control supply of a charging current to the second super capacitor 6112. That is, when the switch 6130 is turned on, a charging current is supplied to the second super capacitor 6112, and when the switch 6130 is turned off, a charging current is not supplied to the second super capacitor 6112. In addition, the switch 6130 may be used to control discharging of the second super capacitor 6112. That is, if the switch 6130 is turned on, a discharging current is supplied from the second super capacitor 6112, and if the switch 6130 is turned off, a discharging current is not supplied from the second super capacitor 6112. The first and second super capacitors 6111 and 6112 may supply a discharging current through a discharging path ②.

The voltage detector 6140 may detect charging voltages or discharging voltages of the first and second super capacitors 6111 and 6112. The voltage detector 6140 may detect a charging voltage or a discharging voltage by measuring the voltage of an N node when the first super capacitor 6111 or the second super capacitor 6112 is charged or discharged.

The control circuit 6150 controls the ground circuit GND, the charging circuit 6120, the switch 6130, and the voltage detector 6140. While the first super capacitor 6111 is used, the control circuit 6150 controls the ground circuit GND so that the second super capacitor 6112 is discharged. In addition, the control circuit 6150 controls the charging circuit 6120 so that a charging current is supplied to the first and second super capacitors 6111 and 6112. The control circuit 6150 can control the switch 6130 so as not to use the second super capacitor 6112. For example, if the capacitance of the first super capacitor 6111 is sufficient, the second super capacitor 6112 may be not used under the control of the control circuit 6150. When the second super capacitor 6112 is not used, a charge unnecessarily stored in the second super capacitor 6112 may be completely discharged through the ground circuit GND under the control of the control circuit 6150. The control circuit 6150 may calculate an equivalent series resistance ESR from a charging voltage or a discharging voltage received from the voltage detector 6140. The ESR is a resistance component from the N node to the first super capacitor 6111 or the second super capacitor 6112. When a charging current is supplied to the first super capacitor 6111, the voltage of the N node is steeply increased for a predetermined time due to the ESR. The ESR can be calculated by using a charging current Ic and an N node voltage Vn.

The control circuit 6150 may receive a charging or discharging voltage from the voltage detector 6140 for calculating the capacitance of the first super capacitor 6111 or the second super capacitor 6112. For example, the control circuit 6150 may calculate a capacitance Cs1 of the first super capacitor 6111 from a charging current, a charging time, and the N node voltage Vn. The control circuit 6150 may include an internal timer (not shown) to count a charging time. The control circuit 6150 may determine the time when the switch 6130 is turned on by using an ESR and the capacitance of the first super capacitor 6111 or the second super capacitor 6112.

Figure 45:
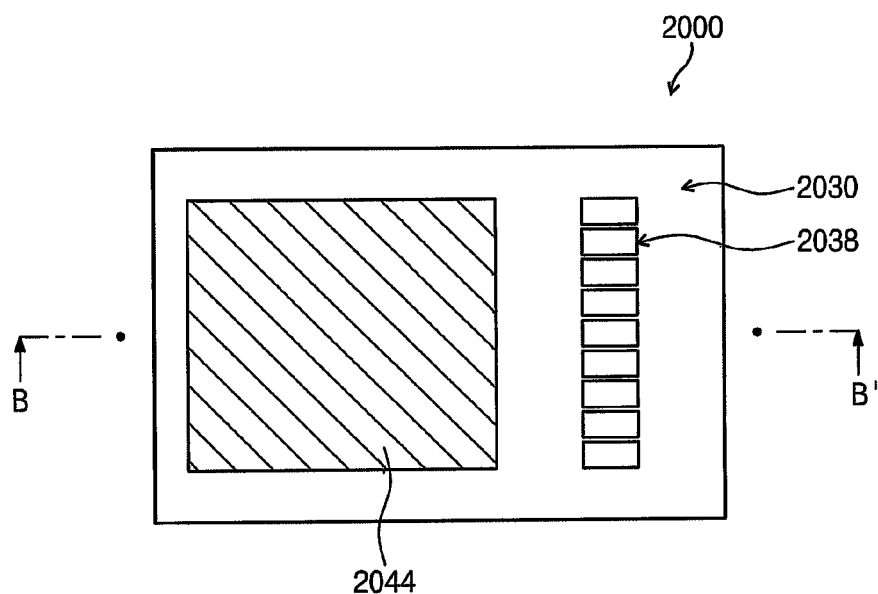
FIG. 45 is a bottom view illustrating a memory card including by-pass pads according to an example embodiment.
Figure 46:
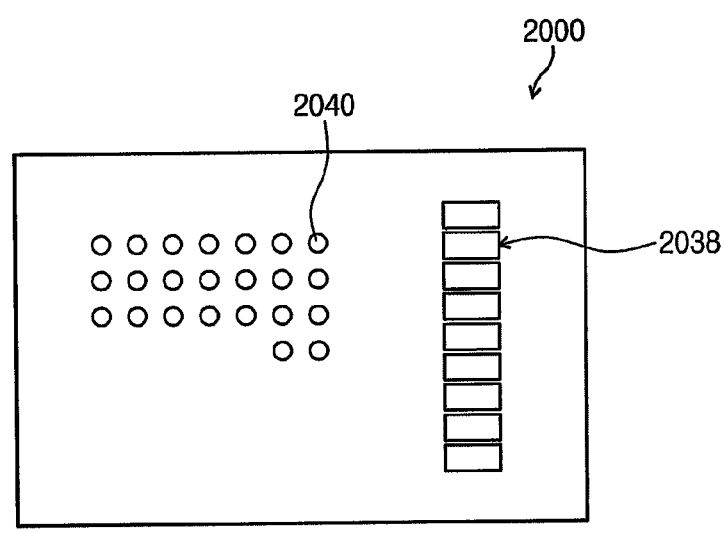
FIG. 46 is a view illustrating the memory card of FIG. 45 when a protection cover is removed from the memory card.
Figure 47:
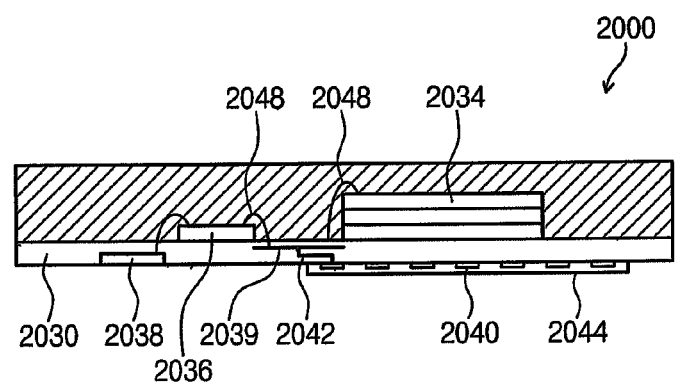
FIG. 47 is a sectional view taken along line B-B' of FIG. 45.

The memory cards of the above-described example embodiments may further include a by-pass pad. The by-pass pad may be electrically connected to a memory chip. An operator may test the electric characteristics of the memory chip through the by-pass pad. FIGS. 45 through 47 illustrate an example memory card 2000 including by-pass pads 2040. FIG. 45 is a bottom view of the memory card 2000. FIG. 46 is a view illustrating the memory card 2000 when a protection cover 2044 is removed from the memory card 2000, and FIG. 47 is a sectional view taken along line B-B' of FIG. 45.

Referring to FIGS. 45 through 47, the memory card 2000 may have a thin parallelepiped shape similar to that of the memory card 200 illustrated in FIGS. 1 through 3. Interconnection terminals 2038 of the memory card 2000 may be similar in position to the interconnection terminals 238 of the memory card 200 illustrated in FIGS. 1 through 3. A controller chip 2036 and memory chips 2034 may be mounted on a circuit board 2030 in a manner such that the controller chip 2036 is spaced apart from the memory chips 2034 in a horizontal direction. Alternatively, the controller chip 2036 may be disposed on the memory chips 2034 like the case of the memory card 200 illustrated in FIGS. 1 through 3. An interconnection line 2039 may be formed in the circuit board 2030, and the controller chip 2036 and the memory chips 2034 may be connected to each other through the interconnection line 2039 and wires 2048. The by-pass pads 2040 are provided on the bottom side of the circuit board 2030. By-pass pads 2040 are connected to by-pass lines 2042 extending from the interconnection line 2039. If the memory card 2000 operates abnormally, an operator can test functions of the memory card 2000 through the by-pass pads 2040 for checking errors of the memory card 2000.

In addition, a protection cover 2044 may be provided so that the by-pass pads 2040 cannot be exposed to the outside of the memory card 2000. The protection cover 2044 covers the by-pass pads 2040. The protection cover 2044 may be provided in the form of an insulating layer. For example, the protection cover 2044 may be formed of solder resist. That is, the bottom side of the circuit board 2030 may be coated with solder resist so that all the by-pass pads 2040 can be covered. If it is necessary to test the memory card 2000, an operator can perform a test after exposing the by-pass pads 2040 by removing the solder resist through etching or polishing. The protection cover 2044 may be an insulating layer formed of an insulating material that can be easily removed by a selective etching process. For example, the protection cover 2044 may be formed of an epoxy based polymer. Alternatively, the protection cover 2044 may be formed of a capsulation material. Alternatively, the protection cover 2044 may be formed of an insulating tape.

Figure 48:
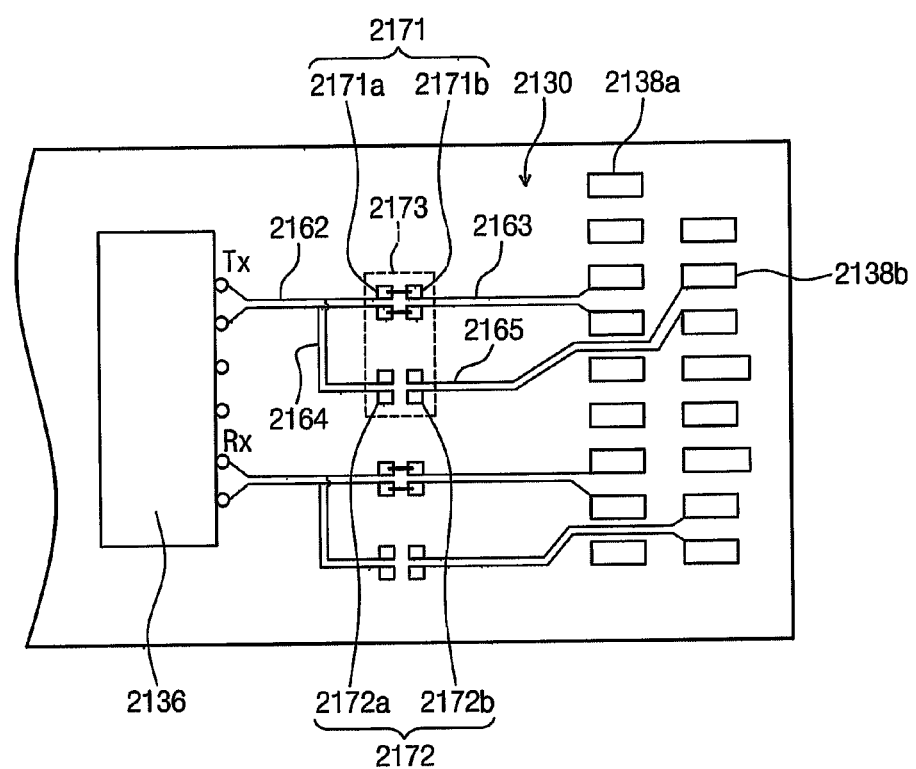
FIG. 48 is a view for illustrating a structure for selectively using one of two sets of interconnection terminals of a memory card according to an example embodiment.

FIG. 48 illustrates an example structure for selectively using one of two sets of interconnection terminals in a memory card such as the memory cards illustrated in FIGS. 26, 29, 30, and 31. FIG. 48 is a schematic bottom view of the memory card. The memory card of FIG. 48 has a structure similar to that of the memory card 1300 illustrated in FIG. 26. In the memory card, data received from or to be stored in a memory chip are transmitted or received through first interconnection terminals 2138*a* or second interconnection terminals 2138*b* by using an output signal Tx or an input signal Rx of a controller chip 2136. Only one controller chip 2136 may be mounted on a circuit board 2130. First capacitor pads 2171 and second capacitor pads 2172 may be disposed between the controller chip 2136 and the first interconnection terminals 2138*a*.

The first capacitor pads 2171 are provided for electric connection between the controller chip 2136 and the first interconnection terminals 2138*a*. The first capacitor pads 2171 include first pads 2171*a* and second pads 2171*b*. The first and second pads 2171*a* and 2171*b* are spaced a predetermined distance from each other and are disposed to face each other. First signal lines 2162 and second signal lines 2163 are formed on the circuit board 2130. The controller chip 2136 and the first pads 2171*a* are electrically connected directly through the first signal lines 2162. The second pads 2171*b* and the first interconnection terminals 2138*a* are electrically connected directly through the second signal lines 2163.

The second capacitor pads 2172 are provided for electric connection between the controller chip 2136 and the second interconnection terminals 2138*b*. The second capacitor pads 2172 include third pads 2172*a* and fourth pads 2172*b*. The third and fourth pads 2172*a* and 2172*b* are spaced a predetermined distance from each other and are disposed to face each other. Third signal lines 2164 and fourth signal lines 2165 are formed on the circuit board 2130. The third signal lines 2164 are extended from the first signal lines 2162 and are electrically connected to the third pads 2172*a*. The fourth pads 2172*b* and the second interconnection terminals 2138*b* are electrically connected directly through the fourth signal lines 2165.

The first pads 2171*a* are electrically connected to the second pads 2171*b* through a capacitor 2173, or the third pads 2172*a* are electrically connected to the fourth pads 2172*b* through the capacitor 2173. The capacitor 2173 may be a DC block capacitor. If the capacitor 2173 is connected between the first pads 2171*a* and the second pads 2171*b*, the memory card may be connected to an external electronic machine through the first interconnection terminals 2138*a*. If the capacitor 2173 is connected between the third pads 2172*a* and the fourth pads 2172*b*, the memory card may be connected to an external electronic machine through the second interconnection terminals 2138*b*.

In example embodiments, the memory card may be or may be used in conjunction with a CompactFlash Type (for example, Type I or II), SD memory card, miniSD, microSD, TransFlash, MultiMediaCard (MMC), MMCplus, RS-MMC, DV RS-MMC, MMCmobile, MMCmicro, Memory Stick, Memory Stick PRO, Memory Stick Duo, Memory Stick PRO Duo, SmartMedia Card, xD-Picture Card, PC Card (for example, Types I, II, or III), and/or USB Flash Drive.

The above-disclosed subject matter is to be considered illustrative and not restrictive, and the appended claims are intended to cover all such modifications, enhancements, and other embodiments, which fall within the true spirit and scope of inventive concepts. Thus, to the maximum extent allowed by law, the scope of inventive concepts is to be determined by the broadest permissible interpretation of the following claims and their equivalents, and shall not be restricted or limited by the foregoing detailed description.

What is claimed is:

1. A memory card comprising:
a front side, a rear side, a first lateral side, a second lateral side, a top side, and a bottom side;
a first set of interconnection terminals on at least one of the top side and the bottom side, the first set of interconnection terminals configured to operatively connect with an external electronic machine,
each of the first set of interconnection terminals has a length parallel to a first direction and the first set of interconnection terminals are arranged along a second direction, and at least some of the first set of interconnection terminals are spaced apart from the front side by a distance greater than lengths of the interconnection terminals, respectively, a first groove is in the top side, an end of the first groove extending to the front side; and
a controller chip and at least one memory chip on the bottom side, wherein
the controller chip is on the memory chip, and
a portion of the memory chip is directly below the first groove.

2. The memory card of claim 1, wherein the first groove has a length parallel to the first direction, and a side of the first groove extends to the first lateral side.

3. The memory card of claim 1, wherein a notch is in the top side, the notch being closer to the rear side than the first groove.

4. The memory card of claim 1, wherein a second groove is in the top side.

5. The memory card of claim 1, wherein the memory card is substantially rectangular, and the first direction is perpendicular to the front side.

6. The memory card of claim 1, wherein a portion of the controller chip is above the first groove.

7. The memory card of claim 1, wherein a chamfer is in the top side between the front side and the first lateral side, to a depth above the bottom side.

8. The memory card of claim 1, wherein a notch is formed in the top side, a depth of the notch is above the bottom side.

9. The memory card of claim 1, wherein
a notch is in the top side and closer to the second lateral side then than the first lateral side, and
an end of the notch is spaced apart from the front side and another end of the notch is spaced apart from the rear side.

10. The memory card of claim 1, wherein the first set of interconnection terminals comprise power interconnection terminals and other power interconnection terminals, and
one or more of the power interconnection terminals are two or more times longer than the other interconnection terminals and are closer to the front side than the other interconnection terminals.

11. The memory card of claim 1, wherein the lengths of the first set of interconnection terminals are equal, and each of the first set of interconnection terminals is spaced the same distance from the front side.

12. The memory card of claim 1, further comprising:
a printed circuit board on the bottom side;
a semiconductor chip on the printed circuit board; and
a mold member configured to cover a top surface of the printed circuit board and the semiconductor chip.

13. The memory card of claim 12, wherein the mold member includes the front side, the rear side, the first lateral side, the second lateral side, and the top side.

14. The memory card of claim 1, further comprising:
a second set of interconnection terminals,
wherein the second set of interconnection terminals are parallel to the first set of interconnection terminals.

15. The memory card of claim 14, wherein the second set of interconnection terminals are between the front side and the first set of interconnection terminals.

16. The memory card of claim 14, wherein a number of the first set of interconnection terminals is different from a number of the second set of interconnection terminals.

17. A memory card comprising:
a front side, a rear side, a first lateral side, a second lateral side, a top side, and a bottom side
a first set of interconnection terminals on at least one of the top side and the bottom side, the first set of interconnection terminals configured to operatively connect with an external electronic machine,
each of the first set of interconnection terminals has a length parallel to a first direction and the first set of interconnection terminals are arranged along a second direction, and at least some of the first set of interconnection terminals are spaced apart from the front side by a distance greater than lengths of the interconnection terminals, respectively; and
a controller chip and at least one memory chip on the bottom side, wherein
a chamfer is in the top side between the front side and the first lateral side, to a depth above the bottom side, and
the controller chip is on the memory chip, a portion of memory chip is directly below the chamfer, and a portion of the controller chip is above a bottom of the chafer.

* * * * *